(12) United States Patent
Kato et al.

(10) Patent No.: US 9,160,319 B2
(45) Date of Patent: Oct. 13, 2015

(54) DA CONVERTER, SOLID-STATE IMAGING DEVICE, DRIVING METHOD OF SOLID-STATE IMAGING DEVICE, AND ELECTRONIC APPARATUS HAVING A CASCADE TRANSISTOR GROUP SWITCH SECTION SELECTING ONE OF A PLURALITY OF CASCADE TRANSISTOR GROUPS ACCORDING TO GAIN SETTING VALUE SET TO A CURRENT GENERATION SECTION

(71) Applicant: Sony Corporation, Tokyo (JP)

(72) Inventors: Yuri Kato, Kanagawa (JP); Yusuke Oike, Kanagawa (JP)

(73) Assignee: Sony Corporation, Tokyo (JP)

( * ) Notice: Subject to any disclaimer, the term of this patent is extended or adjusted under 35 U.S.C. 154(b) by 154 days.

(21) Appl. No.: 14/084,941

(22) Filed: Nov. 20, 2013

(65) Prior Publication Data
US 2014/0166856 A1 Jun. 19, 2014

(30) Foreign Application Priority Data

Dec. 14, 2012 (JP) ................................ 2012-273557

(51) Int. Cl.
*H01J 40/14* (2006.01)
*H03K 4/02* (2006.01)
*H04N 5/378* (2011.01)
*H03M 1/74* (2006.01)

(52) U.S. Cl.
CPC .............. *H03K 4/026* (2013.01); *H03M 1/747* (2013.01); *H04N 5/378* (2013.01)

(58) Field of Classification Search
CPC ......... H03M 1/66; H03M 1/164; H03M 1/70; H04N 5/378
USPC ........ 250/214 R, 208.1, 214.1; 341/136–154; 327/514, 515, 382–427
See application file for complete search history.

(56) References Cited

U.S. PATENT DOCUMENTS 8,081,099 B2 * 12/2011 Ikoma et al. .................. 341/144

FOREIGN PATENT DOCUMENTS

JP 2007-059991 3/2007

* cited by examiner

*Primary Examiner* — Que T Le
(74) *Attorney, Agent, or Firm* — Michael Best & Friedrich LLP

(57) ABSTRACT

Disclosed is a digital-analog converter including a current generation section, a current source transistor bias voltage keeping section, a cascade transistor group switch section, and a conversion section. The current generation section has at least one current source transistor group including a plurality of current source transistors and generates an output current based on a value of a digital input signal. The current source transistor bias voltage keeping section has a plurality of cascade transistor groups each including cascade transistors connected in series to the current source transistors and keeps bias voltages of the current source transistors constant. The cascade transistor group switch section selects one of the plurality of cascade transistor groups. The conversion section performs current-voltage conversion of the output current supplied via the selected cascade transistor group.

8 Claims, 12 Drawing Sheets

DA CONVERTER, SOLID-STATE IMAGING DEVICE, DRIVING METHOD OF SOLID-STATE IMAGING DEVICE, AND ELECTRONIC APPARATUS HAVING A CASCADE TRANSISTOR GROUP SWITCH SECTION SELECTING ONE OF A PLURALITY OF CASCADE TRANSISTOR GROUPS ACCORDING TO GAIN SETTING VALUE SET TO A CURRENT GENERATION SECTION

CROSS REFERENCE TO RELATED APPLICATIONS

This application claims the benefit of Japanese Priority Patent Application JP 2012-273557 filed Dec. 14, 2012, the entire contents of which are incorporated herein by reference.

BACKGROUND

The present disclosure relates to a DA (Digital-Analog) converter, a solid-state imaging device, a driving method of the solid-state imaging device, and an electronic apparatus, and in particular, to a DA converter, a solid-state imaging device, a driving method of the solid-state imaging device, and an electronic apparatus capable of reducing a settling time and accelerating the switching speed of gain settings.

A known solid-state imaging device has an AD (Analog-Digital) converter to perform AD conversion of the pixel signal of each pixel. The AD converter compares an analog pixel signal output from each pixel with a reference signal having a ramp waveform (hereinafter also referred to as a ramp signal) whose level (voltage) changes stepwise with time. In parallel with the comparison processing, the AD converter also performs count processing to determine the digital value of the pixel signal based on a count value at a time at which the comparison processing is finished (see, for example, Japanese Patent Application Laid-open No. 2007-59991).

Accordingly, the solid-state imaging device also has a DA converter to generate the ramp signal and supply the same to the AD converter.

FIGS. 1A and 1B are schematic configuration diagrams of current-control-type DA converters used to generate a ramp signal.

FIG. 1A shows the configuration of a DA converter 1*a* based on a ground GND, and FIG. 1B shows the configuration of a DA converter 1*b* based on a power supply voltage VDD.

Each of the DA converters 1*a* and 1*b* includes a current source I1 composed of a plurality of basic current source cells that generate a constant current, a reference resistor R1 serving as a current-voltage conversion section, and a counter CNT1.

In the ground-based DA converter 1*a*, the reference resistor R1 is connected to the ground GND. In the power-supply-voltage-based DA converter 1*b*, the reference resistor R1 is connected to the power supply voltage VDD.

Each of the DA converters 1*a* and 1*b* counts a clock CLK input to the counter CNT1, determines the number of the basic current source cells selected by the current source I1 based on the count value, and supplies the current to the reference resistor R1 to set the voltage of a resistor value as a reference voltage serving as a ramp signal.

FIG. 2 is a circuit diagram showing a specific configuration example of the ground-based DA converter 1*a* shown in FIG. 1A.

The DA converter 1*a* in FIG. 2 has a ramp signal generation part 2, a gain control signal generation part 3, a counter decoder 4, and a gain decoder 5.

The ramp signal generation part 2 includes a current source transistor group 21, a cascade transistor group 22, a counter selection switch group 23, and a reference resistor R2 serving as a current-voltage conversion section.

The gain control signal generation part 3 includes transistors Tr1 to Tr8 and a capacitor CP1. Here, the transistor Tr2 includes a plurality of transistors and is capable of changing its entire transistor size by selecting a predetermined number of transistors. In this sense, the transistor Tr2 will be referred to as a variable transistor Tr2 below.

The transistor Tr1, the plurality of transistors constituting the variable transistor Tr2, and the transistors Tr5 and Tr6 are made of n channel transistors (NMOS transistors), and the transistors Tr3, Tr4, Tr7, and Tr8 are made of p channel transistors (PMOS transistors).

The ramp signal generation part 2 generates a ramp signal corresponding to a count value DI1, i.e., the decoding result of the counter decoder 4. At this time, the gain of the generated ramp signal (the inclination of the ramp signal) is adjusted according to a bias voltage Vb supplied as a gain control signal from the gain control signal generation part 3.

The current source transistor group 21 includes m (m>1) current source transistors DTr-1 to DTr-m, the cascade transistor group 22 includes m cascade transistors CTr-1 to CTr-m, and the counter selection switch group 23 includes m selection switches CSW-1 to CSW-m.

One of the current source transistors DTr of the current source transistor group 21 is connected in series to one of the cascade transistors CTr of the cascade transistor group 22 and one of the selection switches CSW of the counter selection switch group 23. The current source transistors DTr and the cascade transistors CTr are made of p channel transistors (PMOS transistors).

The gate of the current source transistor DTr-1 is connected to the gate and the drain of the transistor Tr3 of the gain control signal generation part 3, and the current source transistor DTr-1 and the transistor Tr3 constitute a current mirror circuit. The source of the current source transistor DTr-1 is connected to the power supply voltage VDD. The drain of the current source transistor DTr-1 is connected to the source of the cascade transistor CTr-1, and the drain of the cascade transistor CTr-1 is connected to the selection switch CSW-1.

In addition, the gate of the cascade transistor CTr-1 is connected to the gate and the drain of the transistor Tr7 of the gain control signal generation part 3. As will be described later, the source of the transistor Tr7 is connected to the drain and the gate of the transistor Tr8 of the gain control signal generation part 3 and the source of the transistor Tr8 is connected to the power supply voltage VDD. Accordingly, the current source transistor DTr-1, the cascade transistor CTr-1, and the transistors Tr3 and Tr7 of the gain control signal generation part 3 constitute a cascade current mirror circuit. The cascade transistor CTr-1 reduces fluctuations in the voltage between the source and the drain of the current source transistor DTr-1 to stabilize the bias point of the current source transistor DTr-1 (improve the integral non-linearity (INL) of the DA converter 1*a*).

The drain of the cascade transistor CTr-1 is connected to an output node ND1 of the DA converter 1*a* via the selection switch CSW-1. In addition, the reference resistor R2 serving as the current-voltage conversion section is arranged between the output node ND1 and the ground GND.

Similarly, the other current source transistors DTr-2 to DTr-m of the current source transistor group 21 and the cascade transistors CTr-2 to CTr-m of the cascade transistor group 22 also constitute a cascade current mirror circuit with the transistors Tr3 and Tr7 of the gain control signal generation part 3.

The gain control signal generation part 3 generates the bias voltage Vb as the gain control signal corresponding to the gain setting value DGI1, i.e., the decoding result of the gain decoder 5. The gain control signal generation part 3 outputs the generated bias voltage Vb to the ramp signal generation part 2 as a gain adjusting signal.

In addition, the gain control signal generation part 3 generates a bias voltage Vcas (hereinafter also referred to as a cascade control voltage Vcas) supplied to the cascade transistors CTr of the cascade transistor group 22 and outputs the same to the ramp signal generation part 2.

The gain control signal generation part 3 has the diode-connected transistor Tr1 and the variable transistor Tr2 whose transistor size changes according to the gain setting value DGI1, i.e., the decoding result of the gain decoder 5. A reference current Ib is supplied to the drain and the gate of the transistor Tr1, and the source of the transistor Tr1 is connected to the ground GND.

The variable transistor Tr2 includes the plurality of transistors, and each of the gates of the transistors is connected to the gate of the transistor Tr1 to constitute a current mirror circuit. The variable transistor Tr2 changes a gain control current Igain flowing through the variable transistor Tr2 by selecting a predetermined number of transistors according to the decoding value DGI1 of a digital gain setting signal. The capacitor CP1 is connected to a connection node ND2 between the transistor Tr1 and the variable transistor Tr2.

The sources of the transistors Tr3 and Tr4 are connected to the power supply voltage VDD. The gate and the drain of the transistor Tr3 are connected to the gate of the transistor Tr4, the drain of the variable transistor Tr2, and the gates of the respective current source transistors DTr of the ramp signal generation part 2. The transistors Tr3 and Tr4 constitute a current mirror circuit.

The drain of the transistor Tr4 is connected to the drain and the gate of the transistor Tr5 and the gate of the transistor Tr6. The sources of the transistors Tr5 and Tr6 are connected to the ground GND, and the drain of the transistor Tr6 is connected to the drain of the transistor Tr7. The transistors Tr5 and Tr6 also constitute a current mirror circuit.

The source of the transistor Tr8 is connected to the power supply voltage VDD, and the gate and the drain of the transistor Tr8 are connected to the source of the transistor Tr7. The gate and the drain of the transistor Tr7 are connected to the source of the transistor Tr6 and the gates of the respective cascade transistors CTr of the ramp signal generation part 2.

The counter decoder 4 decodes an input digital input signal and controls the ON/OFF of the selection switches CSW-1 to CSW-m of the counter selection switch group 23 according to the resulting count value D11.

The gain decoder 5 decodes an input digital gain setting signal and changes (controls) the transistor size of the variable transistor Tr2 according to the resulting gain value DGI1.

Next, a description will be given of the operations of the DA converter 1a in FIG. 2.

A predetermined number of transistors are selected from the variable transistor Tr2 according to the gain setting value DGI1, i.e., the decoding result of the gain decoder 5. Based on the reference current Ib flowing through the transistor Tr1, a current flows through the selected one or more transistors of the variable transistor Tr2. By the addition of these currents, the gain control current Igain is generated. Then, the gain control signal of the bias voltage Vb corresponding to the gain control current Igain flowing through the variable transistor Tr2 is supplied to the gates of the respective current source transistors DTr of the current source transistor group 21.

In addition, a current mirroring the gain control current Igain is supplied from the transistor Tr4 to the transistor Tr5, and the transistors Tr5 and Tr6 constituting the current mirror circuit generate a cascade transistor control current Icas. Thus, the control signal of the cascade control voltage Vcas is supplied to the gates of the respective cascade transistors CTr of the cascade transistor group 22.

Moreover, at least one of the m selection switches CSW-1 to CSW-m is turned on (selected) according to the count value DI1, i.e., the decoding result of the counter decoder 4. Next, an output current corresponding to the gain control signal of the bias voltage Vb flows through the current source transistors DTr and the cascade transistors CTr connected in series to the selected selection switches CSW. Then, the output currents flowing through the one or more selection switches CSW are added together at an output node ND1 and turn into a ramp output current Iramp. The ramp output current Iramp is converted into a voltage signal by the reference resistor R2 serving as the current-voltage conversion section and output as the ramp signal.

As described above, in the DA converter 1a, the gain control current Igain changes according to the decoding result DGI1 of the digital gain setting signal, i.e., the gain setting value. Further, with a change in the gain control current Igain, the bias voltage Vb supplied to the current source transistors DTr and the cascade control voltage Vcas supplied to the cascade transistors CTr also change. Accordingly, at the switching of gain settings, a settling time for stabilizing the current and the voltage arises.

SUMMARY

FIG. 3 shows changes in the gain control current Igain, the bias voltage Vb, and the cascade control voltage Vcas when the two types of the gain setting values of high and low gain are switched in the DA converter 1a shown in FIG. 2.

The current source transistors DTr desirably have high accuracy to determine the current value of the ramp output current Iramp. Therefore, since the gain control current Igain supplied to the current source transistors DTr is relatively large and controlled at a low impedance, the settling time is relatively short.

On the other hand, the cascade transistors CTr provided to reduce fluctuations in the voltage between the sources and the drains of the current source transistors DTr may not control their gate voltage at higher accuracy than the current source transistors DTr. In addition, from the viewpoint of reducing power consumption due to the addition of devices, the cascade transistor control current Icas is minimized to a greater extent. Therefore, compared with the gate voltages of the current source transistors DTr, it is desirable to have a longer settling time for the gate voltages of the cascade transistors CTr.

As a result, the settling time for the cascade transistors CTr becomes dominant at gain switching, which may reduce frame rates for outputting images, for example, when performing different gain settings for each row or when performing a plurality of different gain settings for each row.

The present technology has been made in view of the above circumstances, and it is therefore desirable to reduce a settling time and accelerate the switching speed of gain settings.

According to an embodiment of the present technology, there is provided a digital-analog converter including a current generation section, a current source transistor bias voltage keeping section, a cascade transistor group switch section, and a conversion section. The current generation section has at least one current source transistor group including a plurality of current source transistors and is configured to generate an output current based on a value of a digital input signal with a reception of a gain control signal corresponding to a predetermined one of a plurality of gain setting values. The current source transistor bias voltage keeping section has a plurality of cascade transistor groups each including cascade transistors connected in series to the current source transistors and is configured to keep bias voltages of the current source transistors constant with a reception of cascade transistor control signals corresponding to the plurality of gain setting values. The cascade transistor group switch section is configured to select one of the plurality of cascade transistor groups according to the gain setting value set to the current generation section. The conversion section is configured to perform current-voltage conversion of the output current supplied via the selected cascade transistor group.

According to another embodiment of the present technology, there is provided a solid-state imaging device including a pixel array unit, an analog-digital conversion unit, and a digital-analog converter. The pixel array unit has a plurality of pixels for photoelectric conversion arrayed in a matrix pattern. The analog-digital conversion unit is configured to compare pixel signals output from the pixels of the pixel array unit with ramp signals serving as reference signals and configured to count a comparison time to perform analog-digital conversion of the pixel signals. The digital-analog converter is configured to generate the ramp signals corresponding to a plurality of gain setting values. The digital-analog converter includes a current generation section, a current source transistor bias voltage keeping section, a cascade transistor group switch section, and a conversion section. The current generation section has at least one current source transistor group including a plurality of current source transistors and is configured to generate an output current based on a value of a digital input signal with a reception of a gain control signal corresponding to a predetermined one of the plurality of gain setting values. The current source transistor bias voltage keeping section has a plurality of cascade transistor groups each including cascade transistors connected in series to the current source transistors and is configured to keep bias voltages of the current source transistors constant with a reception of cascade transistor control signals corresponding to the plurality of gain setting values. The cascade transistor group switch section is configured to select one of the plurality of cascade transistor groups according to the gain setting value set to the current generation section. The conversion section is configured to perform current-voltage conversion of the output current supplied via the selected cascade transistor group.

According to still another embodiment of the present technology, there is provided an electronic apparatus including a solid-state imaging device. The solid-state imaging device includes a pixel array unit, an analog-digital conversion unit, and a digital-analog converter. The pixel array unit has a plurality of pixels for photoelectric conversion arrayed in a matrix pattern. The analog-digital conversion unit is configured to compare pixel signals output from the pixels of the pixel array unit with ramp signals serving as a reference signal and configured to count a comparison time to perform analog-digital conversion of the pixel signals. The digital-analog converter is configured to generate the ramp signals corresponding to a plurality of gain setting values. The digital-analog converter includes a current generation section, a current source transistor bias voltage keeping section, a cascade transistor group switch section, and a conversion section. The current generation section has at least one current source transistor group including a plurality of current source transistors and is configured to generate an output current based on a value of a digital input signal with a reception of a gain control signal corresponding to a predetermined one of the plurality of gain setting values. The current source transistor bias voltage keeping section has a plurality of cascade transistor groups each including cascade transistors connected in series to the current source transistors and is configured to keep bias voltages of the current source transistors constant with a reception of cascade transistor control signals corresponding to the plurality of gain setting values. The cascade transistor group switch section is configured to select one of the plurality of cascade transistor groups according to the gain setting value set to the current generation section. The conversion section is configured to perform current-voltage conversion of the output current supplied via the selected cascade transistor group.

In the above embodiments of the present technology, the digital-analog converter generates, in the current generation section, an output current based on a value of a digital input signal with a reception of a gain control signal corresponding to a predetermined one of a plurality of gain setting values. In addition, the digital-analog converter selects one of the plurality of cascade transistor groups based on the gain setting value set to the current generation section. Moreover, the digital-analog converter performs current-voltage conversion of the output current supplied via the selected cascade transistor group.

According to yet another embodiment of the present technology, there is provided a driving method of a solid-state imaging device including a pixel array unit, an analog-digital conversion unit, and a digital-analog converter. The pixel array unit has a plurality of pixels for photoelectric conversion arrayed in a matrix pattern. The analog-digital conversion unit is configured to compare pixel signals output from the pixels of the pixel array unit with ramp signals serving as reference signal and configured to count a comparison time to perform analog-digital conversion of the pixel signals. The digital-analog converter has a plurality of current source transistor groups each including a plurality of current source transistors and a plurality of cascade transistor groups each including cascade transistors connected in series to the current source transistors and is configured to generate the ramp signal corresponding to a predetermined one of a plurality of gain setting values. The driving method includes: setting the plurality of gain setting values to the plurality of cascade transistor groups by the digital-analog converter; setting the predetermined one of the plurality of gain setting values to the current source transistor groups by the digital-analog converter; selecting the cascade transistor group having the same gain setting value as the gain setting value set to the current source transistor groups by the digital-analog converter; and performing current-voltage conversion of an output current output from the current source transistor group connected to the selected cascade transistor group and outputting the converted output current by the digital-analog converter.

In the above embodiment of the present technology, the digital-analog converter sets the plurality of gain setting values to the plurality of cascade transistor groups, sets the predetermined one of the plurality of gain setting values to the current source transistor groups, selects the cascade transistor group having the same gain setting value as the gain setting value set to the current source transistor groups, and performs current-voltage conversion of an output current output from the current source transistor group connected to the selected cascade transistor group to output the converted output current.

The digital-analog converter, the solid-state imaging device, and the electronic apparatus may be independent apparatuses or may be modules incorporated in other apparatuses.

According to the embodiments of the present technology, it is possible to reduce a settling time and accelerate the switching speed of gain settings.

These and other objects, features and advantages of the present disclosure will become more apparent in light of the following detailed description of best mode embodiments thereof, as illustrated in the accompanying drawings.

DETAILED DESCRIPTION OF EMBODIMENTS

Next, modes for carrying out the present technology (hereinafter referred to as embodiments) will be described. Note that the description will be given in the following order.
1. First Embodiment (First Configuration Example of DA Converter)
2. Second Embodiment (Second Configuration Example of DA Converter)
3. Third Embodiment (Third Configuration Example of DA Converter)
4. Fourth Embodiment (General Configuration Example of Solid-State Imaging Device)
5. Fifth Embodiment (Configuration Example of Imaging Apparatus)

1. First Embodiment

First Configuration Example of DA Converter

Figure 4:
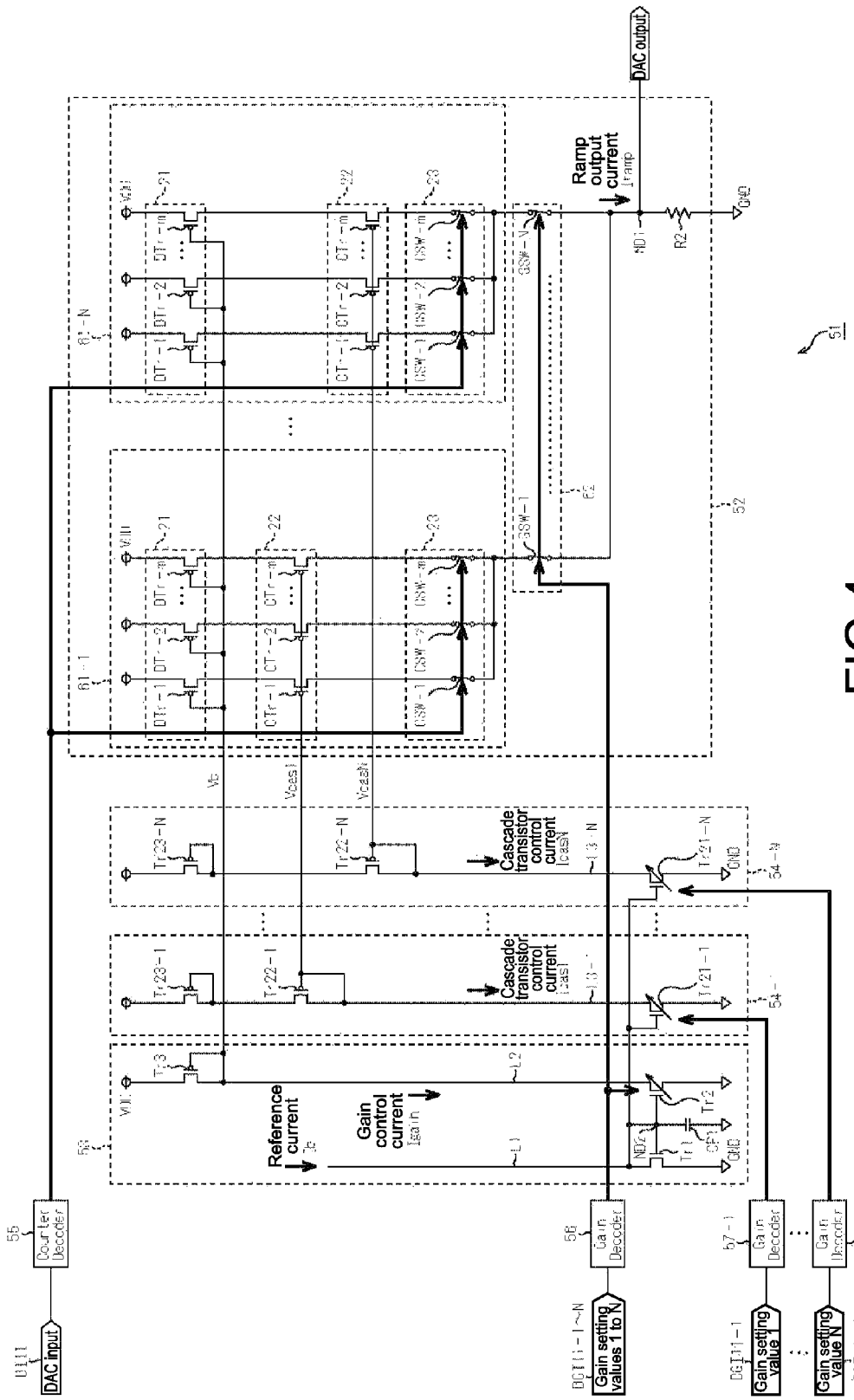
FIG. 4 is a circuit diagram showing a configuration example of a DA converter according to a first embodiment to which the present technology is applied.

FIG. 4 is a circuit diagram showing a configuration example of a DA (Digital-Analog) converter according to a first embodiment to which the present technology is applied.

Figure 2:
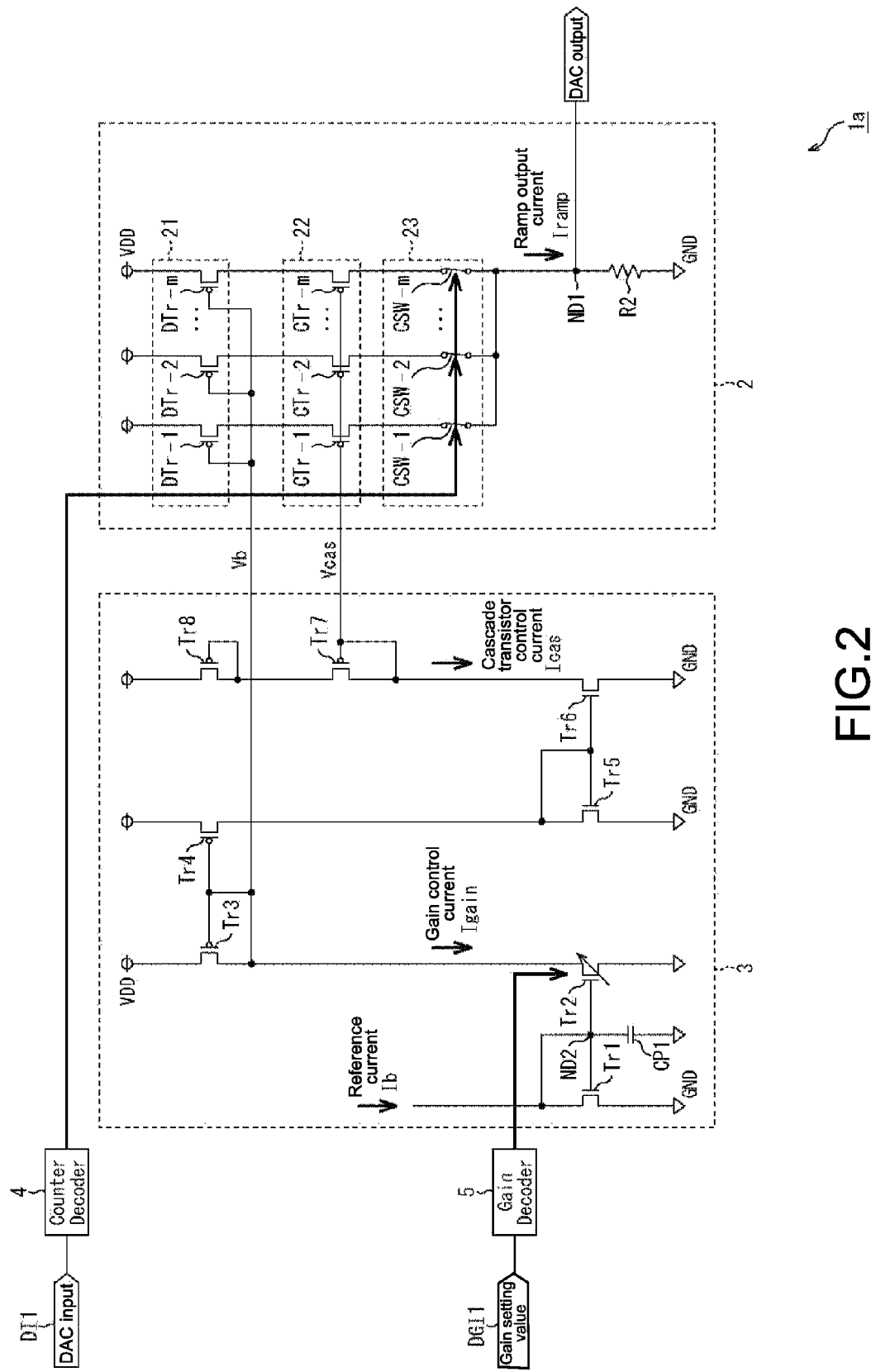
FIG. 2 is a typical circuit diagram of a ground-based DA converter.
Figure 3:
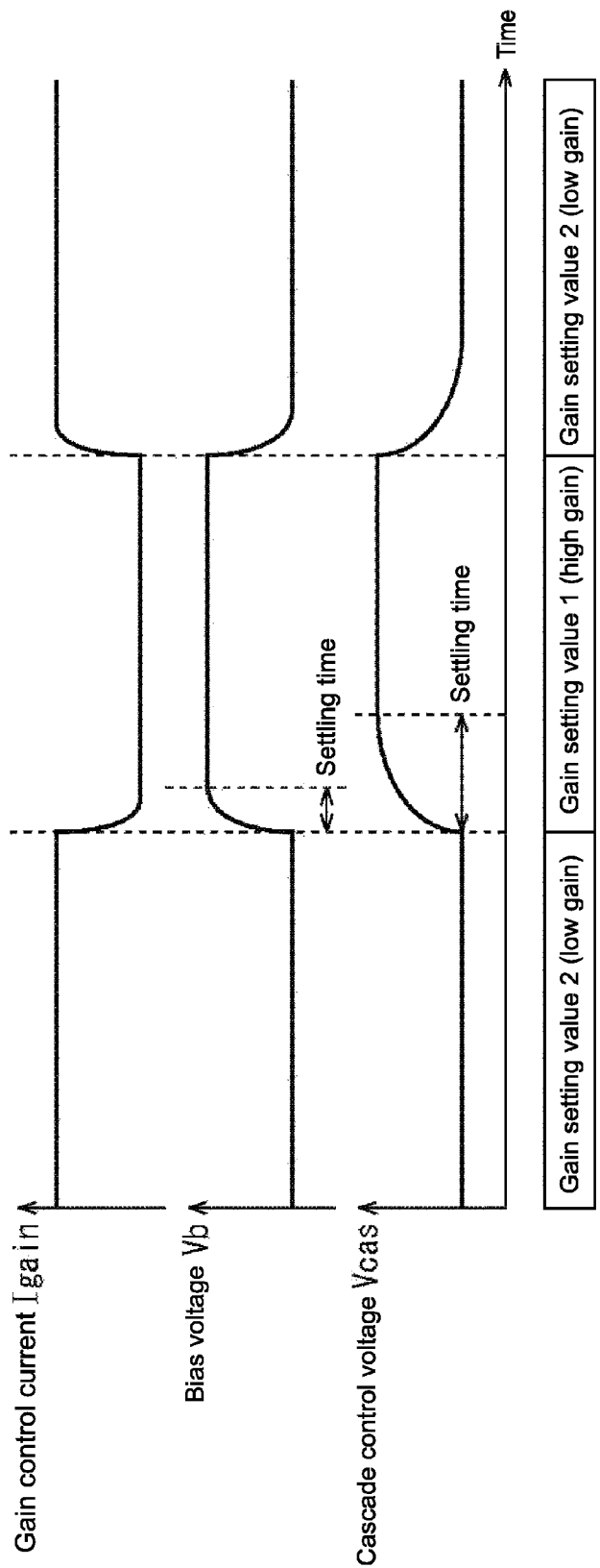
FIG. 3 is a diagram for explaining the settling time of the DA converter in FIG. 2.

A DA converter 51 shown in FIG. 4 is a ground-based DA converter as in FIG. 2. Parts the same as those of FIG. 2 are denoted by the same symbols in FIG. 4, and their descriptions will be omitted as occasion demands.

The DA converter 51 has a ramp signal generation part 52, a gain control signal generation part 53, cascade control signal generation parts 54-1 to 54-N, a counter decoder 55, a gain decoder 56, and gain decoders 57-1 to 57-N.

The ramp signal generation part 52 includes N (N>1) ramp output current generation sections 61-1 to 61-N, a gain selection switch group 62 having N gain selection switches GSW-1 to GSW-N, and a reference resistor R2 serving as a current-voltage conversion section.

Each of the N ramp output current generation sections 61-1 to 61-N includes a current source transistor group 21, a cascade transistor group 22, and a counter selection switch group 23 as in FIG. 2.

Each of the ramp output current generation sections 61-1 to 61-N generates a ramp output current corresponding to a count value DI11, i.e., the decoding result of the counter decoder 55.

The same bias voltage Vb serving as a gain control signal is supplied from the gain control signal generation part 53 to the gates of respective current source transistors DTr of the current source transistor groups 21 of the ramp output current generation sections 61-1 to 61-N.

In the ramp output current generation sections 61-1 to 61-N, however, cascade control voltages Vcas supplied to the respective cascade transistors CTr of the cascade transistor groups 22 are different.

More specifically, a cascade control voltage Vcas1 generated by the cascade control signal generation part 54-1 is supplied to the gates of the respective cascade transistors CTr of the ramp output current generation section 61-1. In addition, a cascade control voltage Vcas2 generated by the cascade control signal generation part 54-2 is supplied to the gates of the respective cascade transistors CTr of the ramp output current generation section 61-2. In the same manner, a cascade control voltage VcasN generated by the cascade control signal generation part 54-N is supplied to the gates of the respective cascade transistors CTr of the ramp output current generation section 61-N.

The respective cascade transistor groups 22 of the ramp output current generation sections 61-1 to 61-N serve as current source transistor bias voltage keeping sections that keep the bias voltages of the respective current source transistors DTr of the current source transistor groups 21 constant.

In the gain selection switch group 62, one of the gain selection switches GSW-1 to GSW-N is turned on (selected) according to a gain setting value DGI11, i.e., the decoding result of the gain decoder 56. Here, the DA converter 51 is allowed to select one of N types of gain at high speed, and one of N setting values DGI11-1 to DGI11-N is taken as the gain setting value DGI11. Accordingly, the gain selection switch group 62 selects one of the ramp output current generation sections 61-1 to 61-N according to the gain setting values DGI11-1 to DGI11-N, i.e., the decoding results, and the ramp output current generated by the selected ramp output current generation section 61 is output to an output node ND1 as a ramp output current Iramp.

The gain control signal generation part 53 includes a transistor Tr1, a variable transistor Tr2, a transistor Tr3, and a capacitor CP1 as in FIG. 2 and generates a gain control current Igain based on a reference current Ib flowing through a control line L1. The variable transistor Tr2 selects a predetermined number of transistors according to the gain setting values DGI11-1 to DGI11-N to change the gain control current Igain flowing through a control line L2.

The cascade control signal generation part 54-1 includes a variable transistor Tr21-1, a transistor Tr22-1, and a transistor Tr23-1. Here, as is the case with the variable transistor Tr2 in FIG. 2, the variable transistor Tr21-1 represents the entirety of a plurality of NMOS transistors capable of changing a transistor size. The gates of the plurality of NMOS transistors constituting the variable transistor Tr21-1 are connected to the gate of the transistor Tr1 to constitute a current mirror circuit. In addition, the transistors Tr22-1 and Tr23-1 include PMOS transistors.

The source of the transistor Tr23-1 is connected to a power supply voltage VDD, and the gate and the drain thereof are connected to the source of the transistor Tr22-1. The gate and the drain of the transistor Tr22-1 are connected to the drain of the variable transistor Tr21-1 and the gates of the respective cascade transistors CTr of the ramp output current generation section 61-1, respectively.

The variable transistor Tr21-1 selects a predetermined number of NMOS transistors according to the gain setting value DGI11-1, i.e., the decoding result of the gain decoder 57-1 to generate a cascade transistor control current Icas1 flowing through a control line L3-1.

The cascade control signal generation parts 54-2 to 54-N are configured in the same manner as the cascade control signal generation part 54-1. However, different gain setting values DGI11-2 to DGI11-N are supplied to the variable transistors Tr21-2 to Tr21-N of the cascade control signal generation parts 54-2 to 54-N. Accordingly, the cascade control signal generation parts 54-2 to 54-N are different from each other in that different cascade transistor control currents Icas2 to IcasN are generated and flow through control lines L3-2 to L3-N. For example, the cascade transistor control current Icas2 corresponding to the decode value DGI11-2 of the gain decoder 57-2 is generated in the cascade control signal generation part 54-2, and the cascade transistor control current IcasN corresponding to the decode value DGI11-N of the gain decoder 57-N is generated in the cascade control signal generation part 54-N.

The counter decoder 55 decodes an input digital input signal and controls the ON/OFF of the selection switches CSW-1 to CSW-m of the ramp output current generation sections 61-1 to 61-N according to the resulting count value DI11.

The gain decoder 56 decodes an input digital gain setting signal and changes (controls) the transistor size of the variable transistor Tr2 according to the resulting gain setting values DGI11-1 to DGI11-N.

In addition, the gain decoder 56 controls the ON/OFF of the gain selection switches GSW-1 to GSW-N of the gain selection switch group 62 according to the gain setting values DGI11-1 to DGI11-N.

The gain decoder 57-1 decodes an input digital gain setting signal and changes (controls) the transistor size of the variable transistor Tr21-1 according to the resulting gain setting value DGI11-1. The gain decoder 57-2 decodes an input digital gain setting signal and changes (controls) the transistor size of the variable transistor Tr21-2 according to the resulting gain setting value DGI11-2. In the same manner, the gain decoder 57-N changes (controls) the transistor size of the variable transistor Tr21-N according to the gain setting value DGI11-N.

The gain decoder 56 may switch the N types of gain setting values DGI11-1 to DGI11-N for each single horizontal scanning period (1 H) or within a single horizontal scanning period according to the input digital gain setting signal. On the other hand, the gain setting values DGI11-1 to DGI11-N of the digital gain setting signals input to the gain decoders 57-1 to 57-N are switched for each frame and kept within a single frame period.

Next, the operations of the DA converter 51 will be described. Here, a description will be given of an example of alternately setting, where N=2, the two types of gain setting values DGI11-1 and DGI11-2 of high and low gain for each single horizontal scanning period.

In a certain single horizontal scanning period, the decoding result of the gain decoder 56 is the gain setting value DGI11-1, and the gain decoder 56 controls a selected transistor (transistor size) inside the variable transistor Tr2 based on the gain setting value DGI11-1.

When the selected transistor inside the variable transistor Tr2 is determined, the gain control current Igain flowing through the variable transistor Tr2 is determined based on the reference current Ib flowing through the control line L1 and flows through the control line L2. Then, the gain control signal of the bias voltage Vb corresponding to the gain control current Igain is supplied to the gates of the respective current source transistors DTr of the current source transistor groups 21 of the ramp output current generation sections 61-1 and 61-2.

In addition, the control signal of the cascade control voltage Vcas1 corresponding to the gain setting value DGI11-1 is generated in the cascade control signal generation part 54-1 and output to the respective cascade transistors CTr of the cascade transistor group 22 of the ramp output current generation section 61-1. More specifically, the transistor size of the variable transistor Tr21-1 of the cascade control signal generation part 54-1 is set at a predetermined value according to the gain setting value DGI11-1, i.e., the decoding result of the gain decoder 57-1. Then, when the reference current Ib flows through the control line L1, the cascade transistor control current Icas1 corresponding to the gain setting value DGI11-1 is generated and flows through the control line L3-1. Thus, the control signal of the cascade control voltage Vcas1 corresponding to the cascade transistor control current Icas1 is supplied to the gates of the respective cascade transistors CTr of the cascade transistor group 22 of the ramp output current generation section 61-1.

Similarly, the control signal of the cascade control voltage Vcas2 corresponding to the gain setting value DGI11-2 is generated in the cascade control signal generation part 54-2 and output to the respective cascade transistors CTr of the cascade transistor group 22 of the ramp output current generation section 61-2. More specifically, the transistor size of the variable transistor Tr21-2 of the cascade control signal generation part 54-2 is set at a predetermined value according to the gain setting value DGI11-2, i.e., the decoding result of the gain decoder 57-2. Then, when the reference current Ib flows through the control line L1, the cascade transistor control current Icas2 corresponding to the gain setting value DGI11-2 is generated and flows through the control line L3-2. Thus, the control signal of the cascade control voltage Vcas2 corresponding to the cascade transistor control current Icas2 is supplied to the gates of the respective cascade transistors CTr of the cascade transistor group 22 of the ramp output current generation section 61-2.

Based on the gain setting value DGI11-1 as the decoding result, the gain decoder 56 selects (turns on) the gain selection switch GSW-1 from among the gain selection switches GSW-1 and GSW-2 of the gain selection switch group 62.

In response to the control of the gain decoder 56, the gain selection switch group 62 selects the ramp output current generation section 61-1 from among the ramp output current generation sections 61-1 and 61-2. Then, an output current is generated by the ramp output current generation section 61-1 connected to the selected gain selection switch GSW-1 and supplied to the output node ND1 as the ramp output current Iramp. The ramp output current Iramp is converted into a voltage signal by the reference resistor R2 serving as the current-voltage conversion section and output as a ramp signal corresponding to the gain setting value DGI11-1.

Then, in the next horizontal scanning period, the digital gain setting signal input to the gain decoder 56 is changed, and the decoding result of the gain decoder 56 is the gain setting value DGI11-2. The gain decoder 56 controls a selected transistor (transistor size) inside the variable transistor Tr2 based on the gain setting value DGI11-2.

When the selected transistor inside the variable transistor Tr2 is determined, the gain control current Igain flowing through the control line L2 changes corresponding to the gain setting value DGI11-2. Then, the gain control signal of the bias voltage Vb corresponding to the gain control current Igain is supplied to the gates of the respective current source transistors DTr of the current source transistor groups 21 of the ramp output current generation sections 61-1 and 61-2.

The digital gain setting signals serving as signals input to the gain decoders 57-1 and 57-2 are not changed. Accordingly, the cascade control signal generation part 54-1 continuously outputs the control signal of the cascade control voltage Vcas1 to the respective cascade transistors CTr of the cascade transistor group 22 of the ramp output current generation section 61-1. In addition, the cascade control signal generation part 54-2 continuously outputs the control signal of the cascade control voltage Vcas2 to the respective cascade transistors CTr of the cascade transistor group 22 of the ramp output current generation section 61-2.

Based on the gain setting value DGI11-2 as the decoding result, the gain decoder 56 selects (turns on) the gain selection switch GSW-2 from among the gain selection switches GSW-1 and GSW-2 of the gain selection switch group 62.

In response to the control of the gain decoder 56, the gain selection switch group 62 selects the ramp output current generation section 61-2 from among the ramp output current generation sections 61-1 and 61-2. Then, an output current is generated by the ramp output current generation section 61-2 connected to the selected gain selection switch GSW-2 and supplied to the output node ND1 as the ramp output current Iramp. The ramp output current Iramp is converted into a voltage signal by the reference resistor R2 serving as the current-voltage conversion section and output as a ramp signal corresponding to the gain setting value DGI11-2.

Then, in the next horizontal scanning period, the digital gain setting signal input to the gain decoder 56 is changed, and the decoding result of the gain decoder 56 is the gain setting value DGI11-1 again. Next, the above operation with the gain setting value DGI11-1 is performed again.

Figure 5:
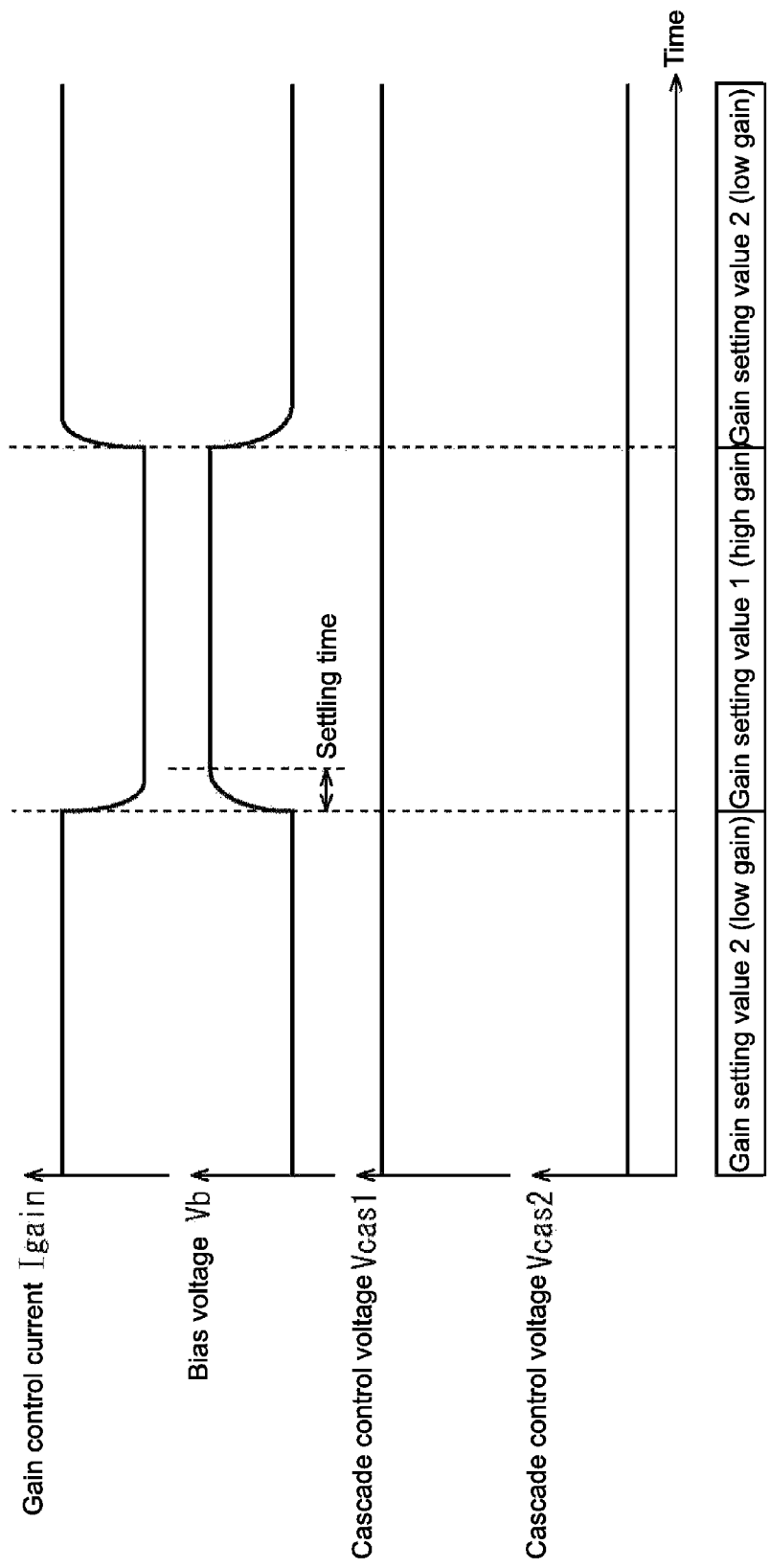
FIG. 5 is a diagram for explaining the settling time of the DA converter in FIG. 4.

FIG. 5 shows changes in the gain control current Igain, the bias voltage Vb, and the cascade control voltage Vcas1 and Vcas2 when the two types of gain setting values of high and low gain are switched in the DA converter 51.

Since the transistor size of the variable transistor Tr2 is changed every time the two types of gain setting values DGI11-1 and DGI11-2 of the high and low gain are changed in the gain decoder 56, the bias voltage Vb changes with the gain control current Igain.

However, since the gain control current Igain is relatively large and has a short settling time as described above, no particular problem is caused.

On the other hand, the cascade control voltage Vcas1 supplied to the gates of the respective cascade transistors CTr of the ramp output current generation section 61-1 is kept within one frame period. In addition, the cascade control voltage Vcas2 supplied to the gates of the respective cascade transistors CTr of the ramp output current generation section 61-2 is kept within one frame period.

Accordingly, since there is no need to consider the settling time of the cascade control voltages Vcas of the cascade transistors CTr as a setting time for gain switching, it is possible to accelerate the switching speed of gain settings.

2. Second Embodiment

Second Configuration Example of DA Converter

Figure 6:
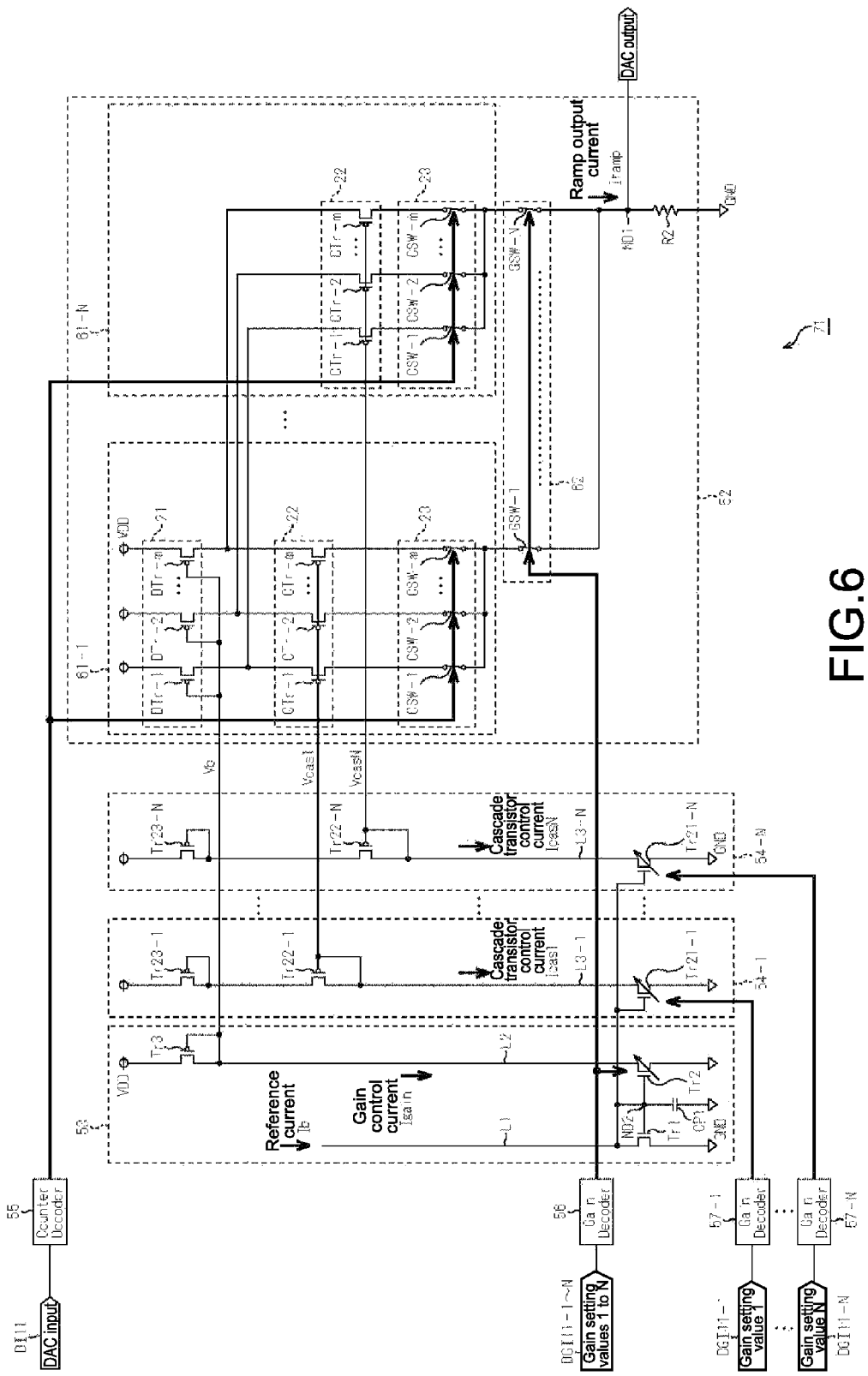
FIG. 6 is a circuit diagram showing a configuration example of a DA converter according to a second embodiment to which the present technology is applied.

FIG. 6 is a circuit diagram showing a configuration example of a DA converter according to a second embodiment to which the present technology is applied.

Parts the same as those of the DA converter 51 according to the first embodiment shown in FIG. 4 are denoted by the same symbols, and their descriptions will be omitted as occasion demands.

A DA converter 71 in FIG. 6 is different from the DA converter 51 in FIG. 4 in that the current source transistor group 21 including the m current source transistors DTr-1 to DTr-m is made common to the ramp output current generation sections 61-1 to 61-N.

In other words, as is the case with the DA converter 51 in FIG. 4, the ramp output current generation section 61-1 includes the current source transistor group 21, the cascade transistor group 22, and the counter selection switch group 23.

Further, the sources of the cascade transistors CTr-1 to CTr-m of the respective cascade transistor groups 22 of the ramp output current generation sections 61-2 to 61-N are connected to the drains of the current source transistors DTr-1 to DTr-m of the ramp output current generation section 61-1.

With the above configuration of the DA converter 71, the elimination of the respective current source transistor groups 21 of the ramp output current generation sections 61-2 to 61-N is made possible. Accordingly, the DA converter 71 is allowed to accelerate the switching speed of gain settings with a smaller circuit configuration (circuit area) than the DA converter 51 in FIG. 4.

3. Third Embodiment

Third Configuration Example of DA converter

Figure 1A:
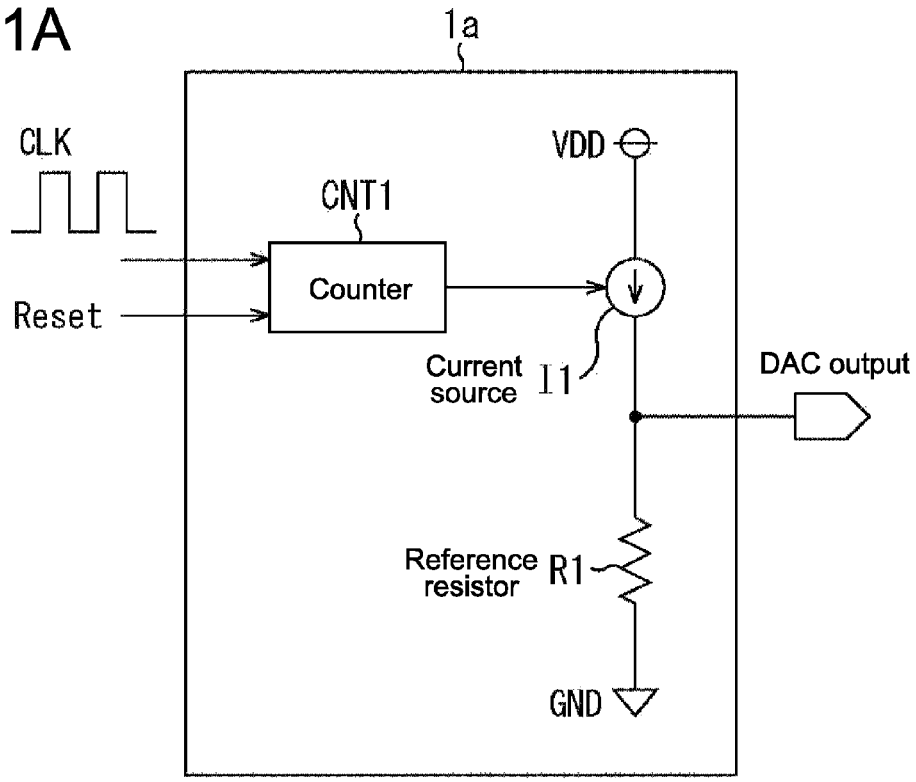
FIGS. 1A and 1B are schematic configuration diagrams of current-control-type DA (Digital-Analog) converters.
Figure 1B:
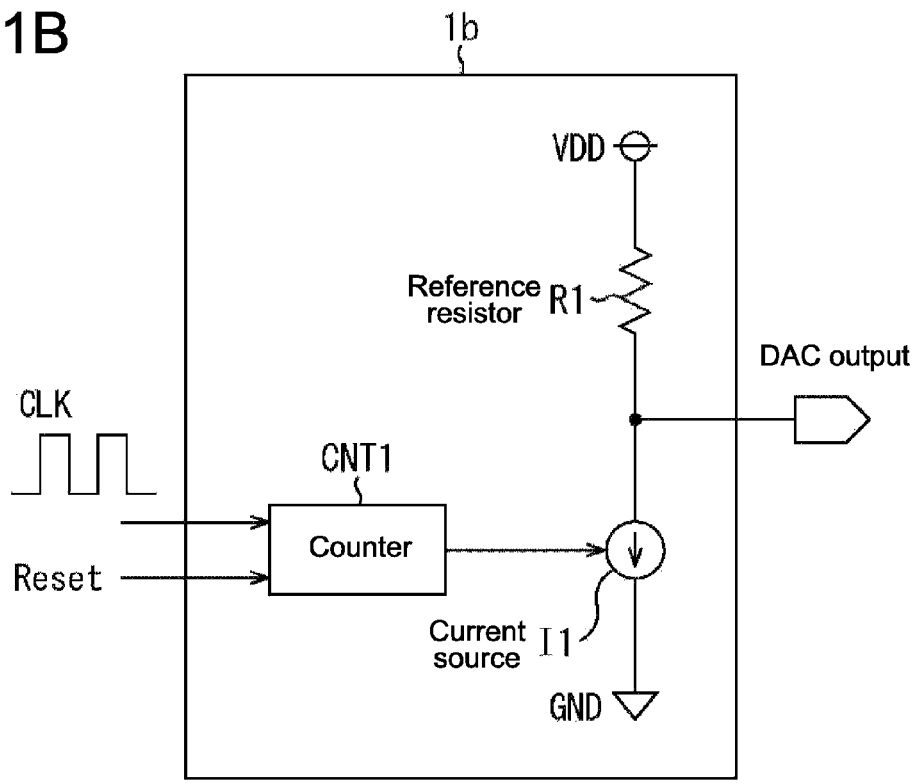

Each of the first and second embodiments describes the configuration example of the ground-based DA converter, but the present technology may also be applied to a DA converter based on a power supply voltage VDD as shown in FIG. 1B. Since the DA converter based on the power supply voltage VDD is capable of reducing a current at the start of a ramp waveform, i.e., at a dark time with the reference voltage of a ramp signal as the power supply voltage VDD, it is allowed to prevent the occurrence of thermal noise.

Figure 7:
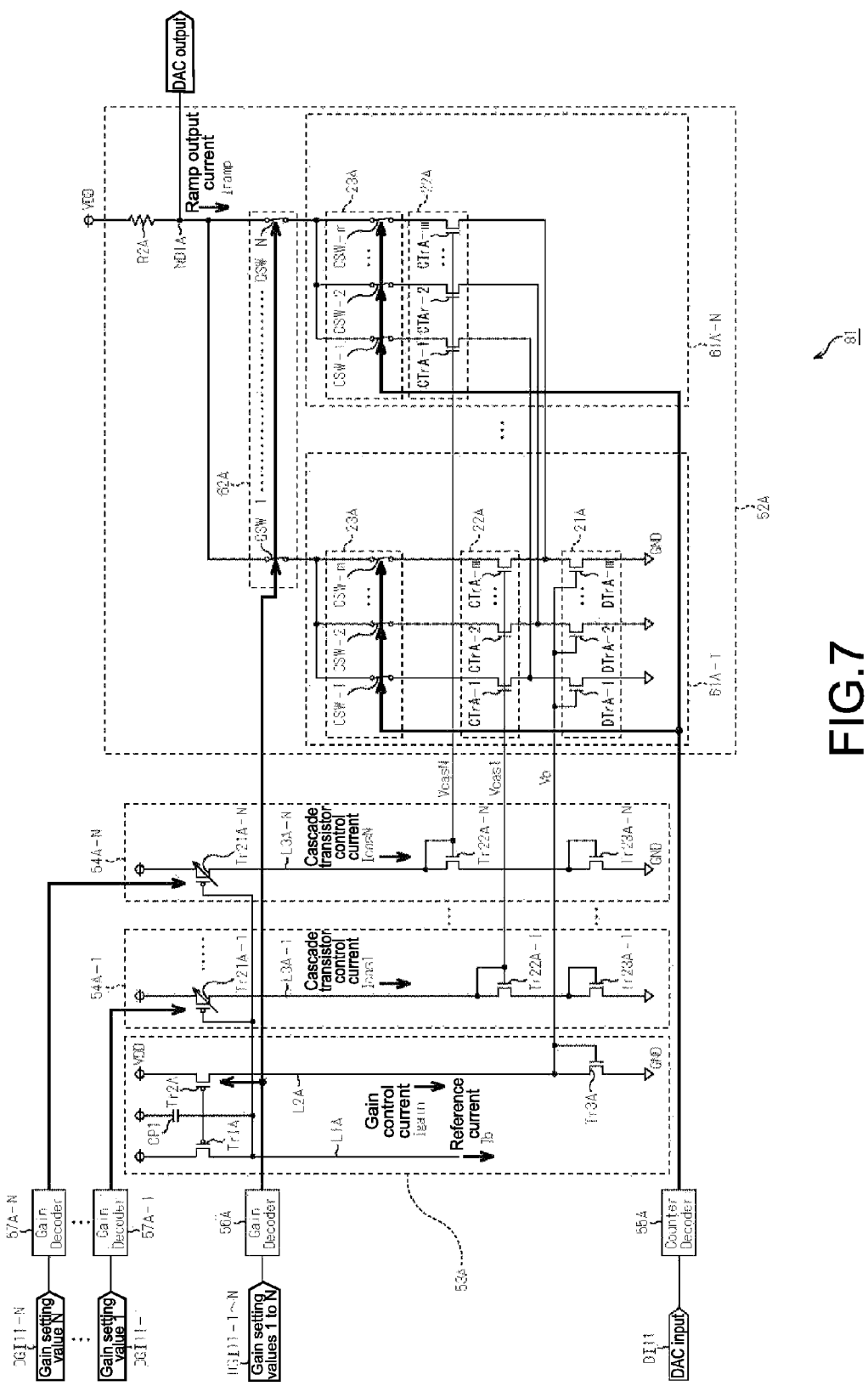
FIG. 7 is a circuit diagram showing a configuration example of a DA converter according to a third embodiment to which the present technology is applied.

FIG. 7 is a circuit diagram showing a configuration example of a DA converter according to a third embodiment to which the present technology is applied.

A DA converter 81 shown in FIG. 7 is configured as a power-supply-voltage-based DA converter corresponding to the second embodiment in which the current source transistor group 21 is made common.

The DA converter 81 has a ramp signal generation part 52A, a gain control signal generation part 53A, cascade control signal generation parts 54A-1 to 54A-N, a counter decoder 55A, a gain decoder 56A, and gain decoders 57A-1 to 57A-N.

The ramp signal generation part 52A includes N ramp output current generation sections 61A-1 to 61A-N, a gain selection switch group 62A having N gain selection switches GSW-1 to GSW-N, and a reference resistor R2A serving as a current-voltage conversion section.

The ramp output current generation section 61A-1 includes a current source transistor group 21A, a cascade transistor group 22A, and a counter selection switch group 23A. Each of the ramp output current generation sections 61A-2 to 61A-N includes the cascade transistor group 22A and the counter selection switch group 23A.

The current source transistor group 21A includes m current source transistors DTrA-1 to DTrA-m. Each of the cascade transistor groups 22A includes m cascade transistors CTrA-1 to CTrA-m. Each of the counter selection switch groups 23A includes m selection switches CSW-1 to CSW-m.

One of the current source transistors DTrA of the current source transistor group 21A is connected in series to one of the cascade transistors CTrA of the respective cascade transistor groups 22A and one of the selection switches CSW of the respective counter selection switch groups 23A. The current source transistors DTrA and the cascade transistors CTrA are made of N channel transistors (NMOS transistors).

Each of the ramp output current generation sections 61A-1 to 61A-N generates a ramp output current corresponding to the count value DI11 of a counter decoder 55A. In each of the ramp output current generation sections 61A-1 to 61A-N, different cascade control voltages Vcas are supplied to the respective cascade transistors CTrA of the cascade transistor groups 22A.

More specifically, a cascade control voltage Vcas1 generated by the cascade control signal generation part 54A-1 is supplied to the gates of the respective cascade transistors CTrA of the ramp output current generation section 61A-1. In addition, a cascade control voltage Vcas2 generated by the cascade control signal generation part 54A-2 is supplied to the gates of the respective cascade transistors CTrA of the ramp output current generation section 61A-2. In the same manner, a cascade control voltage VcasN generated by the cascade control signal generation part 54A-N is supplied to the gates of the respective cascade transistors CTrA of the ramp output current generation section 61A-N.

The current source transistor group 21A of the ramp output current generation section 61A-1 is made common to the ramp output current generation sections 61A-1 to 61A-N. In other words, the sources of the cascade transistors CTrA-1 to CTrA-m of the respective cascade transistor groups 22A of the ramp output current generation sections 61A-2 to 61A-N are connected to the drains of the current source transistors DTrA-1 to DTrA-m of the current source transistor group 21A of the ramp output current generation section 61A-1.

A bias voltage Vb serving as a gain control signal is supplied from the gain control signal generation part 53A to the gates of the respective current source transistors DTrA of the current source transistor group 21A of the ramp output current generation section 61A-1.

In the gain selection switch group 62A, one of the gain selection switches GSW-1 to GSW-N is turned on (selected) according to gain setting values DGI11-1 to DGI11-N, i.e., the decoding results of the gain decoder 56A. In other words, one of the ramp output currents generated by the ramp output current generation sections 61A-1 to 61A-N is selected according to the gain setting values DGI11. A ramp output current Iramp flows based on the selected ramp output current generation section 61A and is converted into a voltage signal by the reference resistor R2A to be output as a ramp signal.

The gain control signal generation part 53A includes a transistor Tr1A, a variable transistor Tr2A, a transistor Tr3A, and a capacitor CP1 and generates a gain control current Igain flowing through a control line L2A based on a reference current Ib flowing through a control line L1A. The variable transistor Tr2A represents the entirety of a plurality of PMOS transistors capable of changing a transistor size. The variable transistor Tr2A selects a predetermined number of transistors according to the gain setting values DGI11-1 to DGI11-N to change the gain control current Igain flowing through the control line L2A.

In the gain control signal generation part 53A, the sources of the transistor Tr1A and the variable transistor Tr2A are connected to a power supply voltage VDD. The gate and the drain of the transistor Tr1A are connected to the gate of the variable transistor Tr2A and one end of the capacitor CP1. The other end of the capacitor CP1 is connected to the power supply voltage VDD. The drain of the variable transistor Tr2A is connected to the drain and the gate of the transistor Tr3A. The source of the transistor Tr3A is connected to a ground GND. The transistor Tr1A and the variable transistor Tr2A are made of PMOS transistors, and the transistor Tr3A is made of an NMOS transistor.

The cascade control signal generation part 54A-1 includes a variable transistor Tr21A-1, a transistor Tr22A-1, and a transistor Tr23A-1. As is the case with the variable transistor Tr2A, the variable transistor Tr21A-1 represents the entirety of a plurality of PMOS transistors capable of changing a transistor size. The gates of the plurality of PMOS transistors constituting the variable transistor Tr21A-1 are connected to the gate and the drain of the transistor Tr1A to constitute a current mirror circuit. In addition, the transistors Tr22A-1 and Tr23A-1 include NMOS transistors.

The source of the transistor Tr23A-1 is connected to the ground GND, and the gate and the drain thereof are connected to the source of the transistor Tr22A-1. The gate and the drain of the transistor Tr22A-1 are connected to the drain of the variable transistor Tr21A-1 and the gates of the respective cascade transistors CTrA of the ramp output current generation section 61A-1, respectively.

The variable transistor Tr21A-1 selects a predetermined number of PMOS transistors according to the gain setting value DGI11-1, i.e., the decoding result of the gain decoder 57A-1 to generate a cascade transistor control current Icas1 flowing through a control line L3A-1.

The cascade control signal generation parts 54A-2 to 54A-N are configured in the same manner as the cascade control signal generation part 54A-1. However, different gain setting values DGI11-2 to DGI11-N are supplied to the variable transistors Tr21A-2 to Tr21A-N of the cascade control signal generation parts 54A-2 to 54A-N. Accordingly, the cascade control signal generation parts 54A-2 to 54A-N are different in that different cascade transistor control currents Icas2 to IcasN are generated and flow through control lines L3A-2 to L3A-N. For example, the cascade transistor control current Icas2 corresponding to the decode value DGI11-2 of the gain decoder 57A-2 is generated in the cascade control signal generation part 54A-2, and the cascade transistor control current IcasN corresponding to the decode value DGI11-N of the gain decoder 57A-N is generated in the cascade control signal generation part 54A-N.

The counter decoder 55A decodes an input digital input signal and controls the ON/OFF of the respective selection switches CSW-1 to CSW-m of the ramp output current generation sections 61A-1 to 61A-N according to the resulting count value DI11.

The gain decoder 56A decodes an input digital gain setting signal and changes (controls) the transistor size of the variable transistor Tr2A according to the resulting gain setting values DGI11-1 to DGI11-N.

In addition, the gain decoder 56A controls the ON/OFF of the gain selection switches GSW-1 to GSW-N of the gain selection switch group 62A according to the gain setting values DGI11-1 to DGI11-N.

The gain decoder 57A-1 decodes an input digital gain setting signal and changes (controls) the transistor size of the variable transistor Tr21A-1 according to the resulting gain setting value DGI11-1. The gain decoder 57A-2 decodes an input digital gain setting signal and changes (controls) the transistor size of the variable transistor Tr21A-2 according to the resulting gain setting value DGI11-2. In the same manner, the gain decoder 57A-N changes (controls) the transistor size of the variable transistor Tr21A-N according to the gain setting value DGI11-N.

The gain decoder 56A may switch the N types of gain setting values DGI11-1 to DGI11-N for each single horizontal scanning period (1 H) or within a single horizontal scanning period according to the input digital gain setting signal. On the other hand, the gain setting values DGI11-1 to DGI11-N of the digital gain setting signals input to the gain decoders 57A-1 to 57A-N are switched for each frame and kept within a single frame period.

Next, the operations of the DA converter 81 will be described. Here, as is the case with the first embodiment, a description will be given of an example of alternately setting, where N=2, the two types of gain setting values DGI11-1 and DGI11-2 of high and low gain for each single horizontal scanning period.

In a certain single horizontal scanning period, the decoding result of the gain decoder 56A is the gain setting value DGI11-1, and the gain decoder 56A controls a selected transistor (transistor size) inside the variable transistor Tr2A based on the gain setting value DGI11-1.

When the selected transistor inside the variable transistor Tr2A is determined, the gain control current Igain flowing through the variable transistor Tr2A is determined based on the reference current Ib flowing through the control line L1A and flows through the control line L2A. Then, the gain control signal of the bias voltage Vb corresponding to the gain control current Igain is supplied to the gates of the respective current source transistors DTrA of the current source transistor groups 21A of the ramp output current generation section 61A-1.

In addition, the control signal of the cascade control voltage Vcas1 corresponding to the gain setting value DGI11-1 is generated in the cascade control signal generation part 54A-1 and output to the respective cascade transistors CTrA of the cascade transistor group 22A of the ramp output current generation section 61A-1. More specifically, the transistor size of the variable transistor Tr21A-1 of the cascade control signal generation part 54A-1 is set at a predetermined value according to the gain setting value DGI11-1, i.e., the decoding result of the gain decoder 57A-1. Then, when the reference current Ib flows through the control line L1A, the cascade transistor control current Icas1 corresponding to the gain setting value DGI11-1 is generated and flows through the control line L3A-1. Thus, the control signal of the cascade control voltage Vcas1 corresponding to the cascade transistor control current Icas1 is supplied to the gates of the respective cascade transistors CTrA of the cascade transistor group 22A of the ramp output current generation section 61A-1.

Similarly, the control signal of the cascade control voltage Vcas2 corresponding to the gain setting value DGI11-2 is generated in the cascade control signal generation part 54A-2 and output to the respective cascade transistors CTrA of the cascade transistor group 22A of the ramp output current generation section 61A-2. More specifically, the transistor size of the variable transistor Tr21A-2 of the cascade control signal generation part 54A-2 is set at a predetermined value according to the gain setting value DGI11-2, i.e., the decoding result of the gain decoder 57A-2. Then, when the reference current Ib flows through the control line L1A, the cascade transistor control current Icas2 corresponding to the gain setting value DGI11-2 is generated and flows through the control line L3A-2. Thus, the control signal of the cascade control voltage Vcas2 corresponding to the cascade transistor control current Icas2 is supplied to the gates of the respective cascade transistors CTrA of the cascade transistor group 22A of the ramp output current generation section 61A-2.

Based on the gain setting value DGI11-1 as the decoding result, the gain decoder 56A selects (turns on) the gain selection switch GSW-1 from among the gain selection switches GSW-1 and GSW-2 of the gain selection switch group 62A.

In response to the control of the gain decoder 56A, the gain selection switch group 62A selects the ramp output current generation section 61A-1 from among the ramp output current generation sections 61A-1 and 61A-2. Then, the ramp output current Iramp flows through the ramp output current generation section 61A-1 connected to the selected gain selection switch GSW-1. The ramp output current Iramp is converted into a voltage signal by the reference resistor R2A serving as the current-voltage conversion section and output as a ramp signal corresponding to the gain setting value DGI11-1 from an output node ND1A.

Then, in the next horizontal scanning period, the digital gain setting signal input to the gain decoder 56A is changed, and the decoding result of the gain decoder 56A is the gain setting value DGI11-2. The gain decoder 56A controls a selected transistor (transistor size) inside the variable transistor Tr2A based on the gain setting value DGI11-2.

When the selected transistor inside the variable transistor Tr2A is determined, the gain control current Igain flowing through the control line L2A changes corresponding to the gain setting value DGI11-2. Then, the gain control signal of the bias voltage Vb corresponding to the gain control current Igain is supplied to the gates of the respective current source transistors DTrA of the current source transistor groups 21A of the ramp output current generation sections 61A-1.

The digital gain setting signals serving as signals input to the gain decoders 57A-1 and 57A-2 are not changed. Accordingly, the cascade control signal generation part 54A-1 continuously outputs the control signal of the cascade control voltage Vcas1 to the respective cascade transistors CTrA of the cascade transistor group 22A of the ramp output current generation section 61A-1. In addition, the cascade control signal generation part 54A-2 continuously outputs the control signal of the cascade control voltage Vcas2 to the respective cascade transistors CTrA of the cascade transistor group 22A of the ramp output current generation section 61A-2.

Based on the gain setting value DGI11-2 serving as the decoding result, the gain decoder 56A selects (turns on) the gain selection switch GSW-2 from among the gain selection switches GSW-1 and GSW-2 of the gain selection switch group 62A.

In response to the control of the gain decoder 56A, the gain selection switch group 62A selects the ramp output current generation section 61A-2 from among the ramp output current generation sections 61A-1 and 61A-2. Then, a ramp output current Iramp flows through the ramp output current generation section 61A-2 connected to the selected gain selection switch GSW-2. The ramp output current Iramp is converted into a voltage signal by the reference resistor R2A serving as the current-voltage conversion section and output as a ramp signal corresponding to the gain setting value DGI11-2 from the output node ND1A.

Then, in the next horizontal scanning period, the digital gain setting signal input to the gain decoder 56A is changed, and the decoding result of the gain decoder 56A is the gain setting value DGI11-2 again. Next, the above operation with the gain setting value DGI11-2 is performed again.

As described above, the cascade control voltages Vcas1 to VcasN corresponding to the gain setting values DGI11-1 to DGI11-N are fixedly set within a single frame period in the ramp output current generation sections 61A-2 to 61A-N in the DA converter 81 based on the power supply voltage VDD. Further, when the gain setting values DGI11 are changed, it is only necessary to select the ramp output current generation sections 61A-1 to 61A-N having the cascade control voltages Vcas1 to VcasN corresponding to the changed gain setting values DGI11-1 to DGI11-N. Accordingly, since there is no need to consider the settling time of the cascade control voltages Vcas as a setting time for gain switching, it is possible to accelerate the switching speed of gain settings.

4. Fourth Embodiment

General Configuration Example of Solid-State Imaging Device

Figure 8:
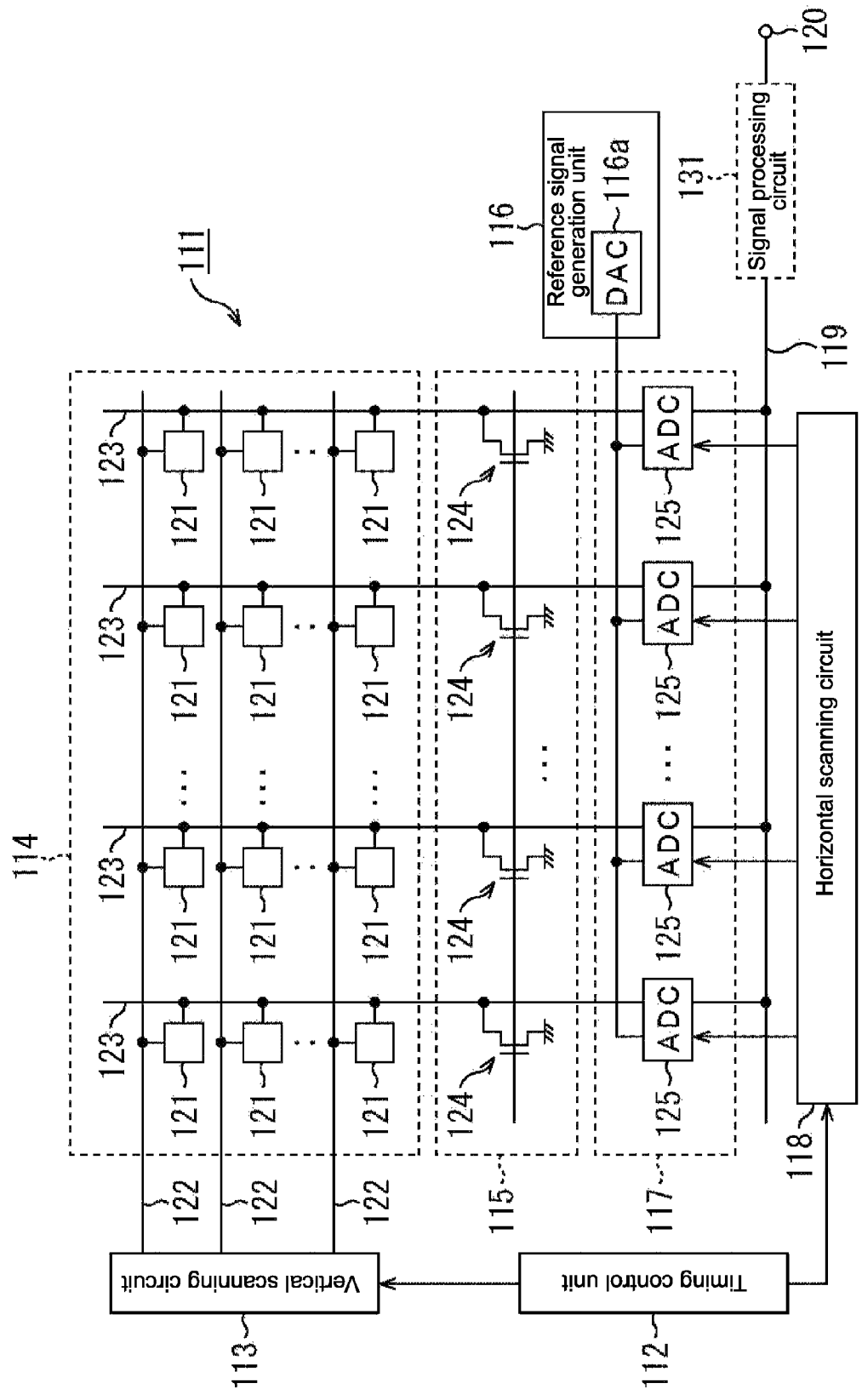
FIG. 8 is a diagram showing a configuration example of a solid-state imaging device according to a fourth embodiment to which the present technology is applied.

FIG. 8 shows a configuration example of a solid-state imaging device (CMOS image sensor) having the DA converter (DA converter 51, 71, or 81) to which the present technology is applied.

A solid-state imaging device 111 in FIG. 8 includes a timing control unit 112, a vertical scanning circuit 113, a pixel array unit 114, a constant current source circuit unit 115, a reference signal generation unit 116, a column AD (Analog-Digital) conversion unit 117, a horizontal scanning circuit 118, a horizontal output line 119, and an output unit 120.

The timing control unit 112 supplies a clock signal or a timing signal for a predetermined operation to the vertical scanning circuit 113 and the horizontal scanning circuit 118 based on a master clock having a predetermined frequency. For example, the timing control unit 112 supplies a timing signal for a shutter operation or a reading operation for pixels 121 to the vertical scanning circuit 113 and the horizontal scanning circuit 118. Although not shown in the figure, the timing control unit 112 also supplies a clock signal or a timing signal for a predetermined operation to the reference signal generation unit 116, the column AD conversion unit 117, or the like.

At a predetermined timing, the vertical scanning circuit 113 successively supplies a signal for controlling the output of a pixel signal to the pixels 121 arrayed in the vertical direction of the pixel array unit 114.

In the pixel array unit 114, the plurality of pixels 121 are arrayed in a two-dimensional array pattern (matrix pattern).

The plurality of pixels 121 arrayed in the two-dimensional array pattern are connected to the vertical scanning circuit 113 on a row-by-row basis by horizontal signal lines 122. In other words, the plurality of pixels 122 arrayed in the same rows inside the pixel array unit 114 are connected to the vertical scanning circuit 113 by the same single horizontal signal lines 122.

In addition, the plurality of pixels 121 arrayed in the two-dimensional array pattern are connected to the horizontal scanning circuit 118 on a column-by-column basis by vertical signal lines 123. In other words, the plurality of pixels 121 arrayed in the same columns inside the pixel array unit 114 are connected to the horizontal scanning circuit 118 by the same single vertical signal lines 123.

According to the signals supplied from the vertical scanning circuit 113 via the horizontal signal lines 122, the respective pixels 121 inside the pixel array unit 114 output the pixel signals corresponding to charges accumulated therein to the vertical signal lines 123. The detailed configuration of the pixels 121 will be described later with reference to FIG. 9.

The constant current source circuit unit 115 has a plurality of load MOS (Metal-Oxide Semiconductor) transistors 124, and each one of the load MOS transistors 124 is connected to each one of the vertical signal lines 123. The load MOS transistors 124 have the gates thereof impressed with bias voltages and the sources thereof grounded and constitute source follower circuits with transistors inside the pixels 121 connected via the vertical signal lines 123.

The reference signal generation unit 116 includes a DAC (Digital-Analog Converter) 116a, generates a reference signal (ramp signal) having a ramp waveform according to the clock signal supplied from the timing control unit 112, and supplies the generated reference signal to the column AD conversion unit 117. As the DAC 116a, the configuration of the DA converter 51, the DA converter 71, the DA converter 81, or the like is employed.

The column AD conversion unit 117 has a plurality of ADCs (Analog-Digital Converters) 125, and each one of the ADCs 125 is arrayed to correspond to the pixel 121 of each one of the columns of the pixel array unit 114. Accordingly, each one of the vertical signal lines 123 is connected to the plurality of pixels 121 and each one of the load MOS transistors 124 and the ADCs 125.

Each of the ADCs 125 applies CDS (Correlated Double Sampling) processing to the pixel signal supplied via the vertical signal line 123 from the pixel 121 in the same column and then further applies AD conversion processing to the same.

More specifically, each of the ADCs 125 has a comparator that compares the pixel signal output from each of the pixels 121 of the pixel array unit 114 with the ramp signal serving as the reference signal and has an up-down counter that counts the comparison time of the comparator.

The comparator outputs a difference signal obtained by the comparison between the pixel signal and the ramp signal to the up-down counter. For example, the comparator supplies a Hi (High) difference signal to the up-down counter if the ramp signal is greater than the pixel signal and supplies a Lo (Low) difference signal to the up-down counter if the ramp signal is smaller than the pixel signal.

The up-down counter counts down only when the Hi difference signal is supplied in a P phase (Preset Phase) AD conversion period and counts up only when the Hi difference signal is supplied in a D phase (Data Phase) AD conversion period. Then, up-down counter outputs the addition result of a down-count value in the P phase AD conversion period and an up-count value in the D phase AD conversion period as pixel data having the CDS processing and the AD conversion processing applied thereto. Note that the up-down counter may count up in the P phase AD conversion period and count down in the D phase AD conversion period.

Each of the ADCs 125 temporarily stores the pixel data having the AD conversion processing applied thereto and outputs the same to the horizontal output line 119 according to the control of the horizontal scanning circuit 118.

The horizontal scanning circuit 118 causes the pixel data items stored in the plurality of ADCs 125 to be successively output to the horizontal output line 119 at a predetermined timing.

The horizontal output line 119 is connected to the output unit 120, and the pixel data output from each of the ADCs 125 is output from the output unit 120 to the outside of the solid-state imaging device 111.

Note that it may also be possible to provide the signal processing circuit 131 at the front stage of the output unit 120 and output data obtained by applying predetermined signal processing such as correction processing to the image data input via the horizontal output line 119 from the output unit 120.

The solid-state imaging device 111 thus configured is a CMOS image sensor called a column AD type in which the ADC 125 that performs the CDS processing and the AD conversion processing is arrayed for each of the vertical columns.

In the solid-state imaging device 111, the above DA converter 51 or the like is employed as the DAC 116a that generates the ramp signal. Thus, with respect to the plurality of pixels 121 arrayed in the two-dimensional array pattern, it is possible to set a different gain setting value for each row and output a pixel signal having different resolution for each row. An example of setting a different gain setting value and acquiring a pixel signal for each row includes processing for acquiring a pixel signal whose gain settings are changed for each color in a pixel array structure in which the pixels 121 of the colors of R (Red), G (Green), and B (Blue) are arrayed on a row-by-row basis.

Moreover, it may also be possible to set a plurality of gain setting values for each row and output a pixel signal having different resolution for each pixel in one row. An example of setting a plurality of gain setting values and acquiring a pixel signal for each row includes processing for acquiring a pixel signal having different gain settings depending on a low-illumination pixel signal and a high-illumination pixel signal.

(Configuration Example of Pixel 121)

For example, the circuit configuration described in Japanese Patent Application Laid-open No. 2011-199816 may be employed as the circuit of the pixel 121 that allows the acquisition of a low-illumination pixel signal set at high gain and a high-illumination pixel signal set at low gain for each pixel. Japanese Patent Application Laid-open No. 2011-199816 discloses the pixel circuit that has a large saturation charge amount while maintaining dark-time characteristics with a first accumulation capacity excellent in the dart-time characteristics and a second accumulation capacity giving higher priority to area efficiency.

Figure 9:
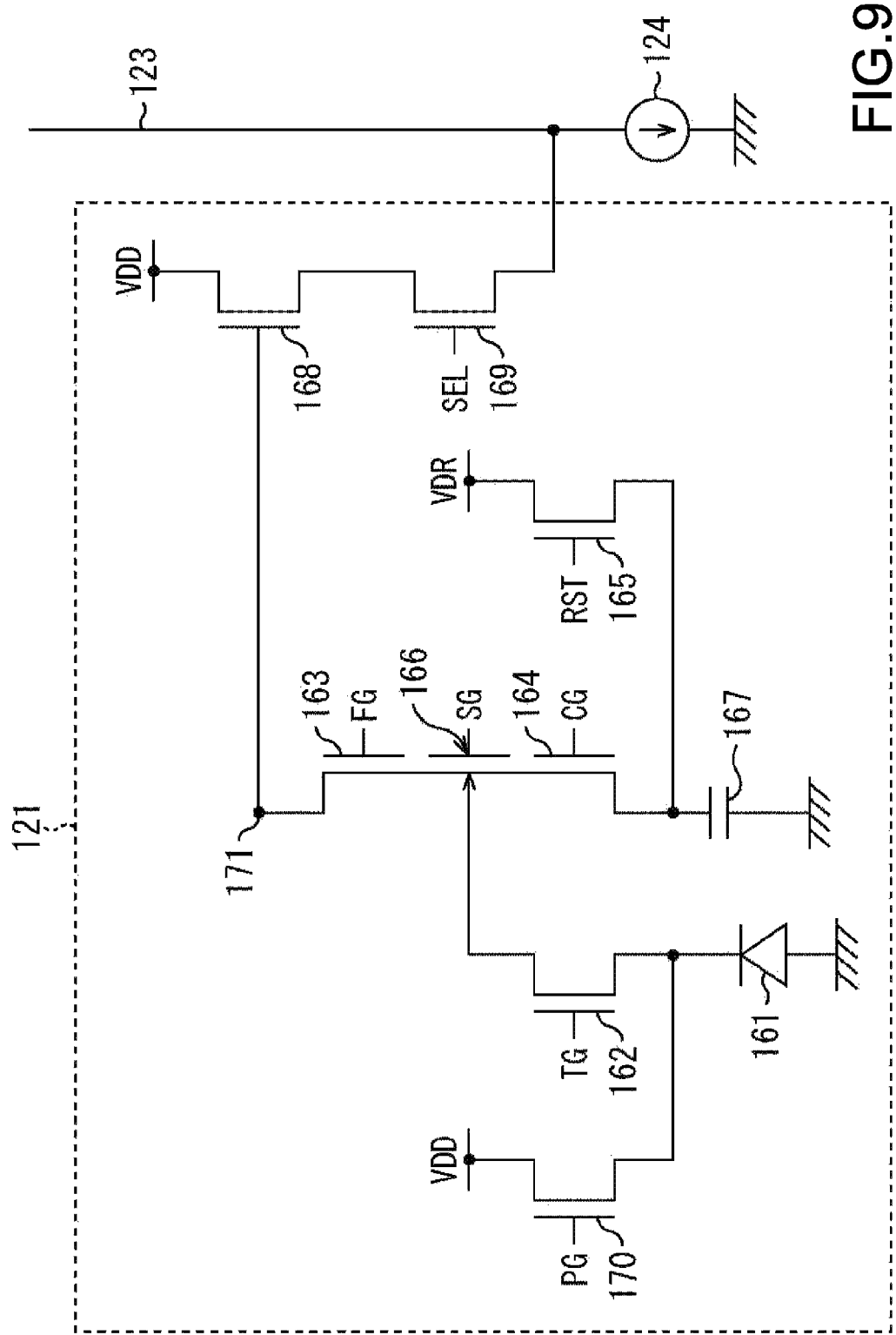
FIG. 9 is a diagram showing the circuit configuration of a pixel in FIG. 8.

FIG. 9 shows the pixel circuit described in Japanese Patent Application Laid-open No. 2011-199816, which is applicable as the circuit configuration of the pixel 121.

As shown in FIG. 9, the pixel 121 has, for example, a PN junction photodiode 161 as a photoelectric conversion section that receives light to generate an optical charge and accumulates the same. In addition, the pixel 121 has a first transfer gate section 162, a second transfer gate section 163, a third transfer gate section 164, a reset gate section 165, a first charge accumulation section 166, a second charge accumulation section 167, an amplification transistor 168, a selection transistor 169, and a charge discharging gate section 170.

The first transfer gate section 162 is connected between the photodiode 161 and the first charge accumulation section 166. A driving signal TG is applied to the gate electrode of the first transfer gate section 162 as a transfer signal. One of the source and the drain of the first transfer gate section 162 is connected to the photodiode 161. As the driving signal TG becomes active, the first transfer gate section 162 is brought into a conductive state. As a result, the first transfer gate section 162 transfers the optical charge accumulated in the photodiode 161 to the first charge accumulation section 166. The optical charge transferred by the first transfer gate section 162 is temporarily stored in the first charge accumulation section 166.

The second transfer gate section 163 is connected between the first charge accumulation section 166 and a floating diffusion section (hereinafter referred to as an FD section) 171. A driving signal FG is applied to the gate electrode of the second transfer gate section 163 as a transfer signal. One of the source and the drain of the second transfer gate section 163 is connected to the FD section 171 to which the gate electrode of the amplification transistor 168 is connected. As the driving signal FG becomes active, the second transfer gate section 163 is brought into a conductive state. As a result, the second transfer gate section 163 transfers the optical charge accumulated in the first charge accumulation section 166 to the FD section 171.

The third transfer gate section 164 is connected between the first charge accumulation section 166 and the second charge accumulation section 167. A driving signal CG is applied to the gate electrode of the third transfer gate section 164 as a transfer signal. As the driving signal CG becomes active, the third transfer gate section 164 is brought into a conductive state. As a result, the third transfer gate section 164 transfers the optical charge accumulated in the first charge accumulation section 166 to the second charge accumulation section 167.

One of the source and the drain of the reset gate section 165 is connected to a reset voltage VDR, and the other thereof is connected to the second charge accumulation section 167. A driving signal RST is applied to the gate electrode of the reset gate section 165 as a reset signal. As the driving signal RST becomes active, the reset gate section 165 is brought into a conductive state. As a result, the reset gate section 165 resets the potential of the second charge accumulation section 167 to the level of the reset voltage VDR.

The first charge accumulation section 166 is provided between the first transfer gate section 162 and the second transfer gate section 163 as an embedded type MOS capacitor. A driving signal SG is applied to the gate electrode of the first charge accumulation section 166. The second charge accumulation section 167 is made of a capacitor having a greater capacity level per unit area than the first charge accumulation section 166.

The gate electrode of the amplification transistor 168 is connected to the FD section 171, and the drain electrode thereof is connected to a VDD. The amplification transistor 168 serves as a reading circuit that reads an optical charge obtained by the photoelectric conversion of the photodiode 161, so-called the input section of a source follower circuit. That is, since the amplification transistor 168 has the source electrode thereof connected to the vertical signal line 123 via the selection transistor 169, it constitutes the source follower circuit with the load MOS transistor 124 (FIG. 8) of the constant current source circuit unit 115, the load MOS transistor being connected to one end of the vertical signal line 123.

The selection transistor 169 is connected between the source electrode of the amplification transistor 168 and the vertical signal line 123. A driving signal SEL is applied to the gate electrode of the selection transistor 169 as a selection signal. As the driving signal SEL becomes active, the selection transistor 169 is brought into a conductive state. As a result, the selection transistor 169 outputs a pixel signal output from the amplification transistor 168 to the vertical signal line 123 in a state in which the pixel 121 is being selected.

The charge discharging gate section 170 is connected between the photodiode 161 and the power supply voltage VDD serving as a charge discharging section. A driving signal PG is applied to the gate electrode of the charge discharging gate section 170 as a charge discharging control signal. As the driving signal PG becomes active, the charge discharging gate section 170 is brought into a conductive state. As a result, the charge discharging gate section 170 selectively discharges a predetermined amount of the optical charges from the photodiode 161 or discharges all the optical charges accumulated in the photodiode 161 to the charge discharging section. The charge discharging gate section 170 is brought into a conductive state in a period in which no optical charge is accumulated, which makes it possible to prevent the photodiode 161 from being saturated with the optical charges and prevent the optical charges exceeding their saturated charge amount from flowing out to the first charge accumulation section 166, the second charge accumulation section 167, or peripheral pixels.

The FD section 171 outputs the optical charges after converting them into an electric signal, for example, a voltage signal.

(Circuit Operations of Pixels 121)

Figure 10:
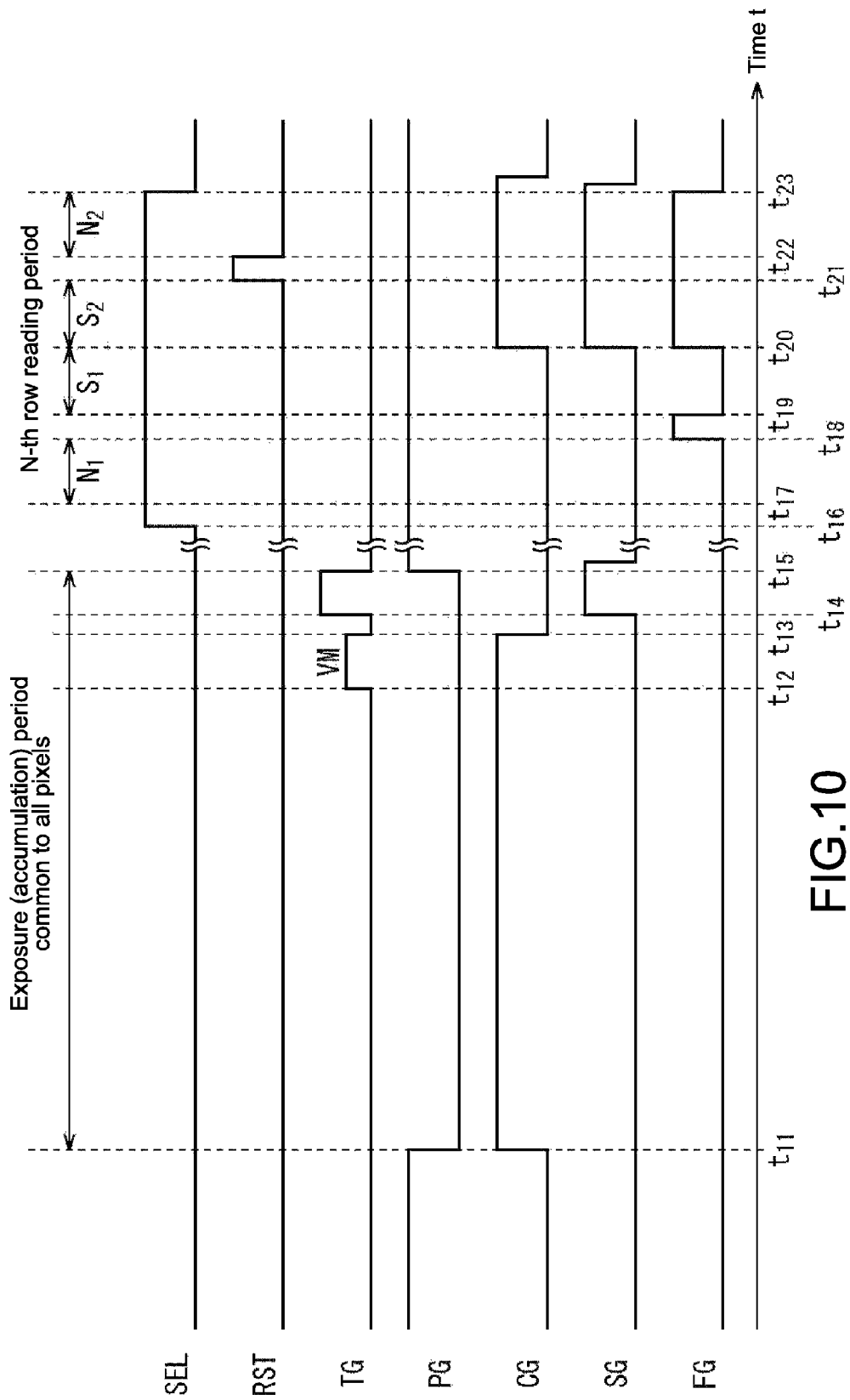
FIG. 10 is a timing chart for explaining the circuit operations of the pixel in FIG. 8.

FIG. 10 is a timing chart for explaining the circuit operations of the pixels 121. FIG. 10 shows the timing relationship between the selection signal SEL, the reset signal RST, the transfer signal TG, the charge discharging control signal PG, the transfer signal CG, the transfer signal SG, and the transfer signal FG.

First, when the charge discharging control signal PG becomes inactive in all the pixels at the same time and the charge discharging gate sections 170 are brought into a nonconductive state at time t11, an exposure period is started in all the pixels of the pixel array unit 114. Since the transfer signal CG becomes active at the same time at the time t11, the third transfer gate sections 164 are brought into a conductive state.

At high illumination, the optical charges flowing out from the photodiodes 161 are accumulated in the first charge accumulation sections 166 via the first transfer gate sections 162 in the exposure period, besides the accumulation of the optical charges in the photodiodes 161. In addition, since the third transfer gate sections 164 are in a state of being conductive, the optical charges flowing out from the first charge accumulation sections 166 are accumulated in the second charge accumulation sections 167 via the third transfer gate sections 164. At low illumination, the optical charges are accumulated only in the photodiodes 161.

Next, when the transfer signal TG is driven by an intermediate potential VM at time t12, the optical charges from the photodiodes 161 in an amount greater than a predetermined charge amount determined by the intermediate potential VM are accumulated in both the first charge accumulation sections 166 and the second charge accumulation sections 167 via the first transfer gate sections 162. Here, the predetermined charge amount represents the saturation charge amount of the first charge accumulation sections 166. Thus, the optical charges are prevented from flowing out from the first charge accumulation sections 166 in the next operation, i.e., in the operation in which the second transfer gate sections 163 are brought into a nonconductive state and the optical charges accumulated in the photodiodes 161 are transferred to the first charge accumulation sections 166.

Then, when the transfer signal CG becomes inactive at time t13, the third transfer gate sections 164 are brought into a nonconductive state.

Next, when the transfer signal TG and the transfer signal SG become active in all the pixels at the same time at time t14, the first transfer gate sections 162 and the gate electrodes of the first charge accumulation sections 166 are brought into a conductive state. Thus, the optical charges accumulated in the photodiodes 161 are transferred to and accumulated in the first charge accumulation sections 166.

Then, when the transfer signal TG becomes inactive and the charge discharging control signal PG becomes active in all the pixels at the same time at time t15, the first transfer gate sections 162 and the charge discharging gate sections 170 are brought into a conductive state. Thus, the exposure period common to all the pixels is finished. Afterwards, the transfer signal SG also become inactive.

In the respective pixels 121, the optical charges at high illumination are accumulated in both the first charge accumulation sections 166 and the second charge accumulation sections 167. On the other hand, the optical charges at low illumination are accumulated only in the first charge accumulation sections 166.

Next, when the selection signal SEL in the N-th row becomes active and the selection transistors 169 in the N-th row are brought into a conductive state at time t16, the pixels 121 in the N-th row are in a state of being selected.

Then, when the transfer signal FG becomes active at time t18, the second transfer gate sections 163 are brought into a conductive state. As a result, the optical charges accumulated in the first charge accumulation sections 166 are transferred to the FD sections 171. The transfer of the optical charges is continued until time t19 at which the transfer signal FG becomes inactive.

The potentials of the FD sections 171 at the time t19 at which the transfer of the optical charges is finished are output to the vertical signal lines 123 as a first signal level S1 corresponding to the accumulated charge amount of the first charge accumulation sections 166 via the amplification transistors 168 and the selection transistors 169.

Next, when the transfer signal CG, the transfer signal SG, and the transfer signal FG become active at the same time at time t20, the third transfer gate sections 164, the gate electrodes of the first charge accumulation sections 166, and the second transfer gate sections 163 are brought into a conductive state. Thus, since the potentials of the FD sections 171, the first charge accumulation sections 166, and the second charge accumulation sections 167 are coupled together, the optical charges are accumulated over the entire coupled region. Then, the optical charges are output to the vertical signal lines 123 as a second signal level S2 via the amplification transistors 168 and the selection transistors 169.

Next, when the reset signal RST becomes active at time t21, the potential-coupled region is reset. Then, when the reset signal RST becomes inactive at time t22, the potential of the potential-coupled region is output to the vertical signal lines 123 as a second reset level N2 via the amplification transistors 168 and the selection transistors 169. The second reset level N2 is also used as a first reset level N1 for the first signal level S1 in the next frame.

Afterwards, the transfer signal FG, the transfer signal SG, and the transfer signal CG are made inactive in this order at time t23 or later, whereby the second transfer gate sections 163, the gate electrodes of the first charge accumulation sections 166, and the third transfer gate sections 164 are brought into a nonconductive state. Thus, the potentials of the pixels 121 are restored to an initial state at the time t21. The reason why the transfer signal FG, the transfer signal SG, and the transfer signal CG are made inactive in this order is to accumulate channel charges accumulated on a substrate surface in the second charge accumulation sections 167 in a state in which the gate electrodes of the first charge accumulation sections 166 are brought into a conductive state. Since reset is not made only by the second charge accumulation sections 167 unlike the FD sections 171, there is no need to concern about an offset occurring in a pixel signal due to the reset of the channel charges or the like.

By the above series of circuit operations, the first signal level S1, the second signal level S2, and the second reset level N2 are successively output in this order from the pixels 121 to the vertical signal lines 123. Further, when the second reset level N2 in a previous frame is used as the first reset level N1 in a current frame, the combination of the first reset level N1 and the first signal level S1 and that of the second signal level S2 and the second reset level N2 are obtained for each row in the current frame.

The first reset level N1 and the first signal level S1 are low-illumination pixel signals excellent in the dark-time characteristics, and the second signal level S2 and the second reset level N2 are high-illumination pixel signals having a large saturation charge amount. The low-illumination pixel signals are desirably read based on high gain settings that produce less noise, and the high-illumination pixel signals are desirably read based on low gain settings that provide a wide signal range. In this case, there is need to switch between the gain setting values of low gain and the gain setting values of high gain in a reading period for each row. To this end, the DA converter 51, the DA converter 71, the DA converter 81, or the like is employed as the DAC 116a of the solid-state imaging device 111 in FIG. 8. Thus, it becomes possible to reduce a switching time for gain settings and perform high-speed reading with a plurality of types of gain setting values. As a result, it becomes possible to read pixels with a plurality of types of gain settings without reducing frame rates (improve the frame rates).

From among the low-illumination pixel signals and the high-illumination pixel signals read from the pixel array unit 114, a suitable pixel signal is selected for each pixel by the signal processing circuit 131 provided inside the solid-state imaging device 111 or a signal processing unit provided at the subsequent stage of the output unit 120 of the solid-state imaging device 111 to constitute an image.

Note that any circuit configuration other than that shown in FIG. 9 may be, of course, employed as the circuit configuration of the pixels 121.

Figure 11:
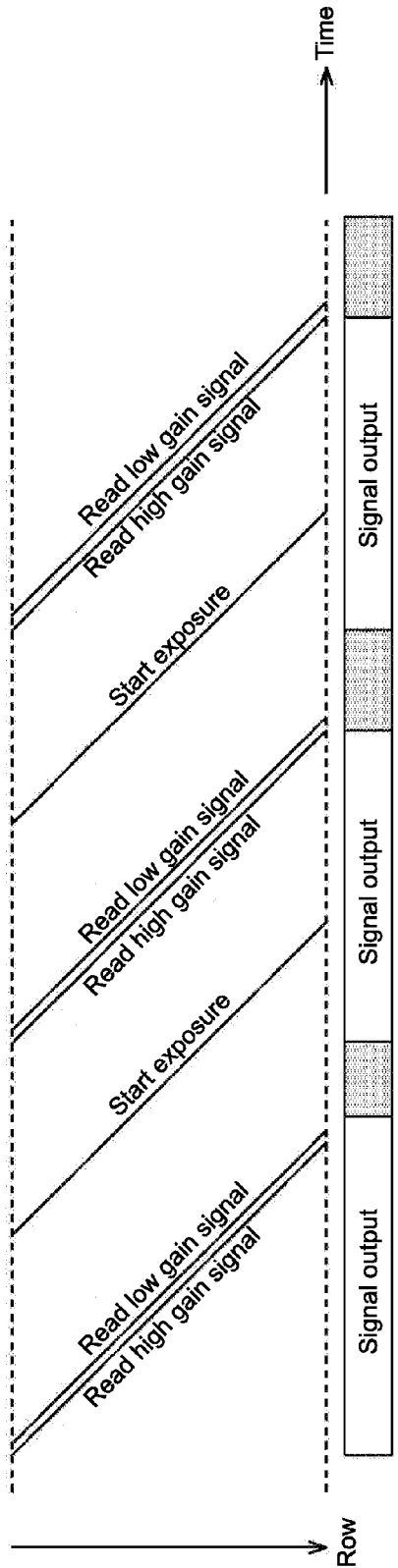
FIG. 11 is a diagram for explaining the driving method of the solid-state imaging device in FIG. 8.

The circuit operation described with reference to FIG. 10 is based on the driving method of a global shutter system in which all the pixels inside the pixel array unit 114 perform a shutter operation at the same time. However, the solid-state imaging device 111 may, of course, employ the driving method of a rolling shutter system in which the pixels 121 that perform a shutter operation shift on a row-by-row basis with time as shown in FIG. 11. Also in this case, the reading of pixel signals based on the gain setting values of low gain and that of pixel signals based on the gain setting values of high gain are performed in a reading period for each row.

5. Fifth Embodiment

Application Example to Electronic Apparatus

The above solid-state imaging device 111 may be applied to, for example, various electronic apparatuses including imaging apparatuses such as digital still cameras and digital video cameras, mobile phones having imaging functions, or other apparatuses having imaging functions.

Figure 12:
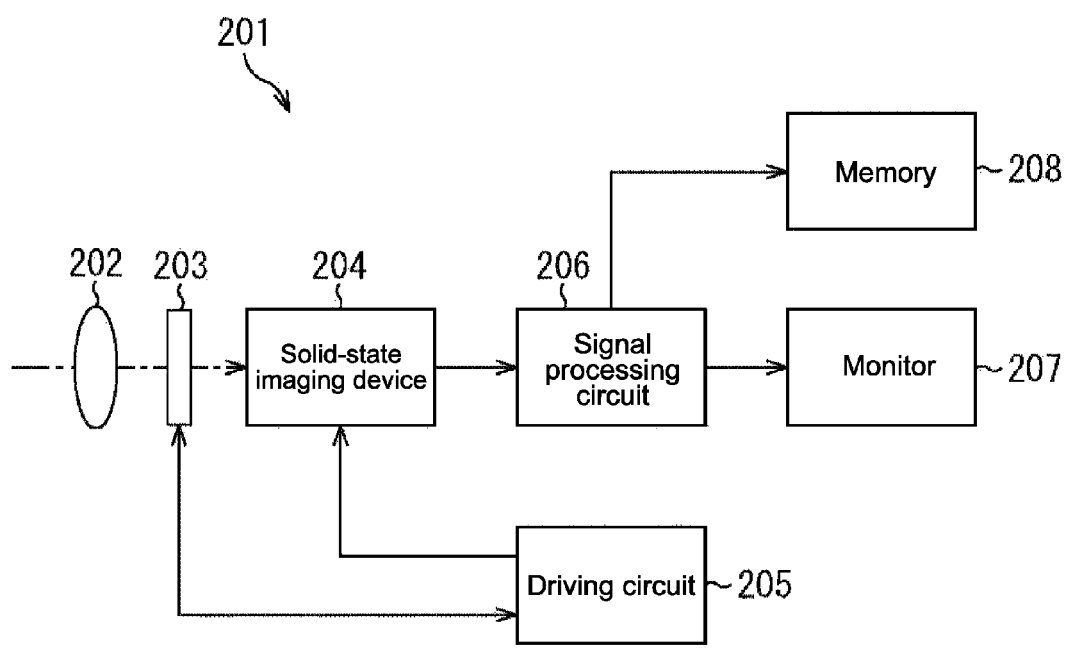
FIG. 12 is a block diagram showing a configuration example of an imaging apparatus serving as an electronic apparatus to which the present technology is applied.

FIG. 12 is a block diagram showing a configuration example of an imaging apparatus serving as an electronic apparatus to which the present technology is applied.

An imaging apparatus 201 shown in FIG. 12 includes an optical system 202, a shutter apparatus 203, a solid-state imaging device 204, a driving circuit 205, a signal processing circuit 206, a monitor 207, and a memory 208, and is capable of shooting still images and moving images.

The optical system 202 includes one or a plurality of lenses and guides light (incident light) from a subject to the solid-state imaging device 204 to form an image on the image receiving surface of the solid-state imaging device 204.

The shutter apparatus 203 is arranged between the optical system 202 and the solid-state imaging device 204 and controls a light irradiation period and a light shielding period to the solid-state imaging device 204 according to the control of the driving circuit 205.

The solid-state imaging device 204 includes the above solid-state imaging device 111. The solid-state imaging device 204 accumulates signal charges for a certain period of time according to the light guided onto the light-receiving surface via the optical system 202 and the shutter apparatus 203. The signal charges accumulated in the solid-state imaging device 204 are transferred according to a driving signal (timing signal) supplied from the driving circuit 205. The solid-state imaging device 204 may be configured as one chip by itself or may be configured as part of a camera module packaged with the optical system 202, the signal processing circuit 206, or the like.

The driving circuit 205 outputs driving signals for controlling the transfer operation of the solid-state imaging device 204 and the shutter operation of the shutter apparatus 203 to drive the solid-state imaging device 204 and the shutter apparatus 203.

The signal processing circuit 206 applies various signal processing to pixel signals output from the solid-state imaging device 204. An image (image data) obtained when the signal processing circuit 206 applies the signal processing to the pixel signals is supplied to and displayed on the monitor 207 or is supplied to and stored (recorded) in the memory 208.

The embodiments of the present technology are not limited to those described above but may be modified in various ways without departing from the spirit of the present technology.

For example, all or some of the plurality of embodiments described above may be combined together.

Note that the present technology may also employ the following configurations.

(1) A digital-analog converter, including:
  a current generation section
    having at least one current source transistor group including a plurality of current source transistors and
    configured to generate an output current based on a value of a digital input signal with a reception of a gain control signal corresponding to a predetermined one of a plurality of gain setting values;
  a current source transistor bias voltage keeping section
    having a plurality of cascade transistor groups each including cascade transistors connected in series to the current source transistors and
    configured to keep bias voltages of the current source transistors constant with a reception of cascade transistor control signals corresponding to the plurality of gain setting values;

a cascade transistor group switch section configured to select one of the plurality of cascade transistor groups according to the gain setting value set to the current generation section; and a conversion section configured to perform current-voltage conversion of the output current supplied via the selected cascade transistor group.

(2) The digital-analog converter according to (1), in which the number of the current source transistor groups is one, and the output current generated by the one current source transistor group is supplied to each of the plurality of cascade transistor groups.

(3) The digital-analog converter according to (1), in which the number of the current source transistor groups is the same as the number of the cascade transistor groups, and the output current generated by one of the current source transistor groups is supplied to corresponding one of the cascade transistor groups.

(4) A solid-state imaging device, including:

a pixel array unit having a plurality of pixels for photoelectric conversion arrayed in a matrix pattern;

an analog-digital conversion unit configured to compare pixel signals output from the pixels of the pixel array unit with ramp signals serving as reference signals and configured to count a comparison time to perform analog-digital conversion of the pixel signals; and a digital-analog converter configured to generate the ramp signals corresponding to a plurality of gain setting values, the digital-analog converter including a current generation section having at least one current source transistor group including a plurality of current source transistors and configured to generate an output current based on a value of a digital input signal with a reception of a gain control signal corresponding to a predetermined one of the plurality of gain setting values, a current source transistor bias voltage keeping section having a plurality of cascade transistor groups each including cascade transistors connected in series to the current source transistors and configured to keep bias voltages of the current source transistors constant with a reception of cascade transistor control signals corresponding to the plurality of gain setting values, a cascade transistor group switch section configured to select one of the plurality of cascade transistor groups according to the gain setting value set to the current generation section, and a conversion section configured to perform current-voltage conversion of the output current supplied via the selected cascade transistor group.

(5) An electronic apparatus, including:

a solid-state imaging device including a pixel array unit having a plurality of pixels for photoelectric conversion arrayed in a matrix pattern, an analog-digital conversion unit configured to compare pixel signals output from the pixels of the pixel array unit with ramp signals serving as reference signals and configured to count a comparison time to perform analog-digital conversion of the pixel signals, and a digital-analog converter configured to generate the ramp signals corresponding to a plurality of gain setting values, the digital-analog converter including a current generation section having at least one current source transistor group including a plurality of current source transistors and configured to generate an output current based on a value of a digital input signal with a reception of a gain control signal corresponding to a predetermined one of the plurality of gain setting values, a current source transistor bias voltage keeping section having a plurality of cascade transistor groups each including cascade transistors connected in series to the current source transistors and configured to keep bias voltages of the current source transistors constant with a reception of cascade transistor control signals corresponding to the plurality of gain setting values, a cascade transistor group switch section configured to select one of the plurality of cascade transistor groups according to the gain setting value set to the current generation section, and a conversion section configured to perform current-voltage conversion of the output current supplied via the selected cascade transistor group.

(6) A driving method of a solid state imaging device including a pixel array unit having a plurality of pixels for photoelectric conversion arrayed in a matrix pattern, an analog-digital conversion unit configured to compare pixel signals output from the pixels of the pixel array unit with ramp signals serving as reference signals and configured to count a comparison time to perform analog-digital conversion of the pixel signals, and a digital-analog converter having a plurality of current source transistor groups each including a plurality of current source transistors and a plurality of cascade transistor groups each including cascade transistors connected in series to the current source transistors and configured to generate the ramp signal corresponding to a predetermined one of a plurality of gain setting values, the driving method including:

setting the plurality of gain setting values to the plurality of cascade transistor groups by the digital-analog converter;

setting the predetermined one of the plurality of gain setting values to the current source transistor groups by the digital-analog converter;

selecting the cascade transistor group having the same gain setting value as the gain setting value set to the current source transistor groups by the digital-analog converter; and performing current-voltage conversion of an output current output from the current source transistor group connected to the selected cascade transistor group and outputting the converted output current by the digital-analog converter.

(7) The driving method according to (6), in which the operation of setting the predetermined gain setting value to the current source transistor groups is performed for each row of the plurality of pixels arrayed in the matrix pattern.

(8) The driving method according to (6) or (7), in which the operation of setting the predetermined gain setting value to the current source transistor groups is performed a plurality of times for each row of the plurality of pixels arrayed in the matrix pattern.

What is claimed is:

1. A digital-analog converter, comprising:
a current generation section
having at least one current source transistor group including a plurality of current source transistors and configured to generate an output current based on a value of a digital input signal with a reception of a gain control signal corresponding to a predetermined one of a plurality of gain setting values;
a current source transistor bias voltage keeping section
having a plurality of cascade transistor groups each including cascade transistors connected in series to the current source transistors and
configured to keep bias voltages of the current source transistors constant with a reception of cascade transistor control signals corresponding to the plurality of gain setting values;
a cascade transistor group switch section configured to select one of the plurality of cascade transistor groups according to the gain setting value set to the current generation section; and
a conversion section configured to perform current-voltage conversion of the output current supplied via the selected cascade transistor group.

2. The digital-analog converter according to claim 1, wherein
the number of the current source transistor groups is one, and
the output current generated by the one current source transistor group is supplied to each of the plurality of cascade transistor groups.

3. The digital-analog converter according to claim 1, wherein
the number of the current source transistor groups is the same as the number of the cascade transistor groups, and
the output current generated by one of the current source transistor groups is supplied to corresponding one of the cascade transistor groups.

4. A solid-state imaging device, comprising:
a pixel array unit having a plurality of pixels for photoelectric conversion arrayed in a matrix pattern;
an analog-digital conversion unit
configured to compare pixel signals output from the pixels of the pixel array unit with ramp signals serving as reference signals and
configured to count a comparison time to perform analog-digital conversion of the pixel signals; and
a digital-analog converter configured to generate the ramp signals corresponding to a plurality of gain setting values,
the digital-analog converter including
a current generation section
having at least one current source transistor group including a plurality of current source transistors and
configured to generate an output current based on a value of a digital input signal with a reception of a gain control signal corresponding to a predetermined one of the plurality of gain setting values,
a current source transistor bias voltage keeping section
having a plurality of cascade transistor groups each including cascade transistors connected in series to the current source transistors and
configured to keep bias voltages of the current source transistors constant with a reception of cascade transistor control signals corresponding to the plurality of gain setting values,
a cascade transistor group switch section configured to select one of the plurality of cascade transistor groups according to the gain setting value set to the current generation section, and
a conversion section configured to perform current-voltage conversion of the output current supplied via the selected cascade transistor group.

5. An electronic apparatus, comprising:
a solid-state imaging device including
a pixel array unit having a plurality of pixels for photoelectric conversion arrayed in a matrix pattern,
an analog-digital conversion unit
configured to compare pixel signals output from the pixels of the pixel array unit with ramp signals serving as reference signals and
configured to count a comparison time to perform analog-digital conversion of the pixel signals, and
a digital-analog converter configured to generate the ramp signals corresponding to a plurality of gain setting values,
the digital-analog converter including
a current generation section
having at least one current source transistor group including a plurality of current source transistors and
configured to generate an output current based on a value of a digital input signal with a reception of a gain control signal corresponding to a predetermined one of the plurality of gain setting values,
a current source transistor bias voltage keeping section
having a plurality of cascade transistor groups each including cascade transistors connected in series to the current source transistors and
configured to keep bias voltages of the current source transistors constant with a reception of cascade transistor control signals corresponding to the plurality of gain setting values,
a cascade transistor group switch section configured to select one of the plurality of cascade transistor groups according to the gain setting value set to the current generation section, and
a conversion section configured to perform current-voltage conversion of the output current supplied via the selected cascade transistor group.

6. A driving method of a solid state imaging device including
a pixel array unit having a plurality of pixels for photoelectric conversion arrayed in a matrix pattern,
an analog-digital conversion unit
configured to compare pixel signals output from the pixels of the pixel array unit with ramp signals serving as reference signals and
configured to count a comparison time to perform analog-digital conversion of the pixel signals, and
a digital-analog converter
having a plurality of current source transistor groups each including a plurality of current source transistors and a plurality of cascade transistor groups each including cascade transistors connected in series to the current source transistors and
configured to generate the ramp signal corresponding to a predetermined one of a plurality of gain setting values, the driving method comprising:

setting the plurality of gain setting values to the plurality of cascade transistor groups by the digital-analog converter;

setting the predetermined one of the plurality of gain setting values to the current source transistor groups by the digital-analog converter;

selecting the cascade transistor group having the same gain setting value as the gain setting value set to the current source transistor groups by the digital-analog converter; and performing current-voltage conversion of an output current output from the current source transistor group connected to the selected cascade transistor group and outputting the converted output current by the digital-analog converter.

7. The driving method according to claim 6, wherein
the operation of setting the predetermined gain setting value to the current source transistor groups is performed for each row of the plurality of pixels arrayed in the matrix pattern.

8. The driving method according to claim 6, wherein
the operation of setting the predetermined gain setting value to the current source transistor groups is performed a plurality of times for each row of the plurality of pixels arrayed in the matrix pattern.

* * * * *